(12) United States Patent
Kikushima

(10) Patent No.: US 11,594,545 B2
(45) Date of Patent: Feb. 28, 2023

(54) SEMICONDUCTOR MEMORY DEVICE AND METHOD OF MANUFACTURING SEMICONDUCTOR MEMORY DEVICE

(71) Applicant: Kioxia Corporation, Minato-ku (JP)

(72) Inventor: Fumie Kikushima, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 116 days.

(21) Appl. No.: 16/987,712

(22) Filed: Aug. 7, 2020

(65) Prior Publication Data

US 2021/0091094 A1 Mar. 25, 2021

(30) Foreign Application Priority Data

Sep. 19, 2019 (JP) .............................. JP2019-170454

(51) Int. Cl.
*H01L 27/1157* (2017.01)
*H01L 27/11578* (2017.01)

(52) U.S. Cl.
CPC .... *H01L 27/1157* (2013.01); *H01L 27/11578* (2013.01)

(58) Field of Classification Search
CPC ........... H01L 27/1157; H01L 27/11578; H01L 27/11582; H01L 27/11524; H01L 27/11551
See application file for complete search history.

(56) References Cited

U.S. PATENT DOCUMENTS

2009/0146206 A1* 6/2009 Fukuzumi ......... H01L 27/11556
257/E21.442

2018/0006053 A1 1/2018 Ohashi et al.
2019/0296041 A1* 9/2019 Yamasaka ......... H01L 27/11582

FOREIGN PATENT DOCUMENTS

JP 2009-135324 A 6/2009

OTHER PUBLICATIONS

Krishna Parat, et. al., "A Floating Gate Based 3D NAND Technology With CMOS Under Array", IEDM15, Invited paper, 2015, 4 pages.

* cited by examiner

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor memory device includes a substrate, a plurality of first conductive layers, a second conductive layer, a first pillar, and a second pillar. The plurality of first conductive layers are stacked over the substrate in a first direction. The second conductive layer is disposed over the plurality of first conductive layers. The first pillar extends inside the plurality of first conductive layers in the first direction. The first pillar includes a first semiconductor portion including a first semiconductor of single-crystal. The second pillar extends inside the second conductive layer in the first direction. The second pillar includes an insulating portion serving as an axis including an insulator and a second semiconductor portion which is disposed on an outer circumference of the insulating portion in view of the first direction. The second semiconductor portion is in contact with the first semiconductor portion and includes a second semiconductor of poly-crystal.

12 Claims, 36 Drawing Sheets

SEMICONDUCTOR MEMORY DEVICE AND METHOD OF MANUFACTURING SEMICONDUCTOR MEMORY DEVICE

CROSS-REFERENCE TO RELATED APPLICATION

This application is based upon and claims the benefit of Japanese Patent Application No. 2019-170454, filed Sep. 19, 2019; the entire contents of which are incorporated herein by reference.

FIELD

Embodiments described herein relate generally to a semiconductor memory device and a method for manufacturing a semiconductor memory device.

BACKGROUND

There have been developed NAND memory devices with three dimensional memory cell stacks.

DETAILED DESCRIPTION

Figure 1:
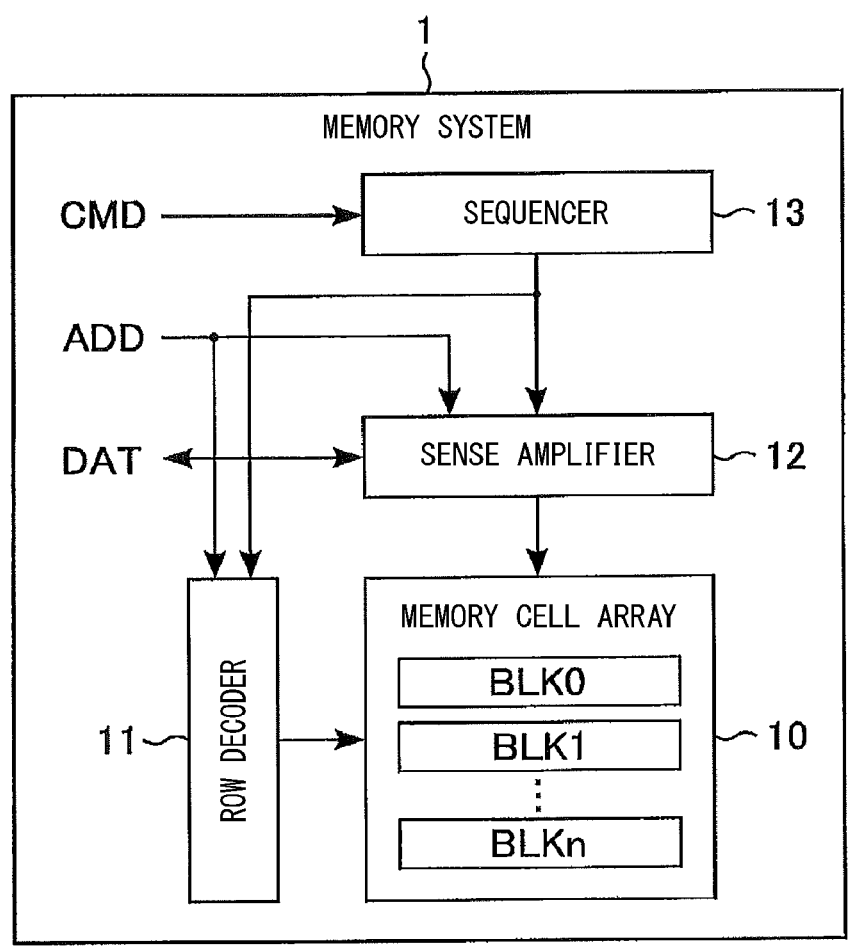
FIG. 1 is a block diagram showing a system configuration of a semiconductor memory device of a first embodiment.

According to some embodiments, a semiconductor memory device may include, but not limited to, a substrate, a plurality of first conductive layers, a second conductive layer, a first pillar and a second pillar. The plurality of first conductive layers are stacked over the substrate in a first direction. The second conductive layer is disposed over the plurality of first conductive layers. The first pillar extends inside the plurality of first conductive layers in the first direction. The first pillar includes a first semiconductor portion including a first semiconductor of single-crystal. The second pillar extends inside the second conductive layer in the first direction. The second pillar includes an insulating portion as an axis including an insulator and a second semiconductor portion. The second semiconductor portion is disposed on an outer circumference of the insulating portion in view of the first direction. The second semiconductor portion is in contact with the first semiconductor portion. The second semiconductor portion includes a second semiconductor of poly-crystal.

Embodiments of a semiconductor memory device and a method of manufacturing a semiconductor memory device will hereinafter be described with reference to the accompanying drawings. In the following descriptions, components having the same function or similar functions are denoted by the same reference numerals and signs. Duplicate descriptions for components having the same function or similar functions may not omitted. In addition, the terms "parallel", "orthogonal", "same", and "equivalence" used herein in the disclosure include "substantially parallel", "substantially orthogonal", "substantially same", and "substantially equivalent".

The term "connection" used in the disclosure is not limited only to physical connection but also includes electrical connection. That is, the term "connection" is not limited only to a case where two elements are in direct contact with each other but also includes an indirect contact where another member is present between two elements. The term "contact" used herein in the present specification means direct contact. The terms "overlap", "face", and "adjacent" used in the disclosure are not limited only to a case where two elements directly face each other or a case where two elements are in direct contact with each other, but also include another case where two elements indirectly face each other or one or more elements are present between the two elements.

In the following descriptions, a +X-direction (second direction), a −X-direction (second direction), a +Y-direction, and a −Y-direction are directions parallel to a surface 20a of a silicon substrate (substrate) 20 of a semiconductor memory device 1 of a first embodiment shown in FIG. 1. The +X-direction is a direction from one string unit of the semiconductor memory device 1 to a string unit adjacent thereto through an insulating slit SLT. The −X-direction is a direction opposite to the +X-direction. In a case where the +X-direction and the −X-direction are not distinguished from each other, these directions will be simply referred to as an "X-direction". The +Y-direction and the −Y-direction are directions intersecting the X-direction. The −Y-direction is a direction opposite to the +Y-direction. In a case where the +Y-direction and the −Y-direction are not distinguished from each other, these directions will be simply referred to as a "Y-direction". The +Z-direction (first direction) and the −Z-direction (first direction) are directions intersecting the X-direction and the Y-direction. The +Z-direction is a direction parallel to a thickness direction of a silicon substrate 20. The −Z-direction is a direction opposite to the +Z-direction. In a case where the +Z-direction and the −Z-direction are not distinguished from each other, these directions will be simply referred to as a "Z-direction". The "+Z-direction" may be referred to as "upward" and the "−Z-direction" may be referred to as "downward". Expressions of "upward" and "downward" are used for convenience and do not necessarily specify the direction of gravity. In the following embodiments, the +Z-direction is an example of a "first direction". For example, when describing that a portion is in the +Z-direction with respect to one component, description may be given using "over" and "upward" with respect to one component.

<Overall Configuration of Semiconductor Memory Device>

The semiconductor memory device 1 is a non-volatile semiconductor memory device and is, for example, a NAND flash memory. FIG. 1 is a block diagram of the semiconductor memory device 1. As shown in FIG. 1, the semiconductor memory device 1 includes, for example, at least one or more memory cells, a row decoder 11, a sense amplifier 12, and a sequencer 13. Hereinafter, the semiconductor memory device 1 includes a memory cell array 10 including a plurality of memory cells.

The memory cell array 10 includes a plurality of blocks BLK0 to BLKn. Here, n is an integer of 1 or greater and represents the order of the plurality of blocks BLK. Each of the plurality of blocks BLK is set of a plurality of non-volatile memory cell transistors. The memory cell array 10 is provided with a plurality of bit lines and a plurality of word lines. Each of the memory cell transistors is electrically connected to one bit line and one word line.

The row decoder 11 selects one block BLK on the basis of address information ADD received from an external memory controller (not shown) of the semiconductor memory device 1. The row decoder 11 applies a desired voltage to each of a plurality of word lines to control a data write operation and a data read operation for the memory cell array 10.

The sense amplifier 12 applies a desired voltage to each of a plurality of bit lines in accordance with data DAT received from the memory controller. The sense amplifier 12 determines data stored in a memory cell transistor on the basis of a voltage of a bit line and transmits the determined data DAT to the memory controller. The sequencer 13 controls the overall operation of the semiconductor memory device 1 on the basis of a command CMD received from the memory controller.

<Electrical Configuration of Memory Cell Array>

Figure 2:
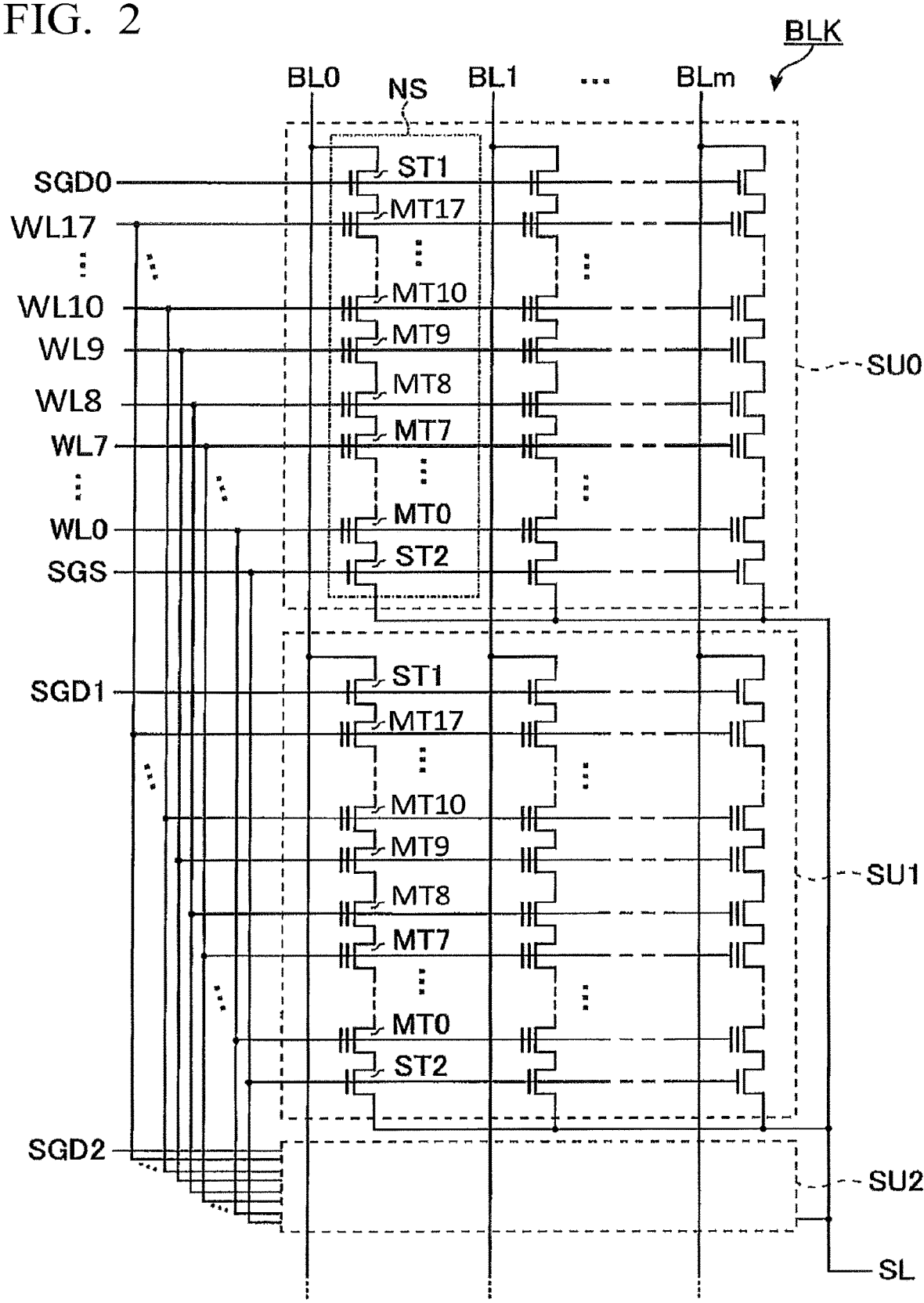
FIG. 2 is a schematic view showing an equivalent circuit of a memory cell array of the semiconductor memory device of the first embodiment.

FIG. 2 is a diagram showing an equivalent circuit of the memory cell array 10 and shows one block BLK. The block BLK includes, for example, a plurality of string units SU. In FIG. 2, for example, four string units SU0 to SU2 are shown.

Each of the plurality of string units SU is a set of a plurality of NAND strings NS. One end of each of the plurality of NAND strings NS is connected to any one of a plurality of bit lines BL0 to BLm. Here, m is an integer of 1 or greater and represents the order of the plurality of bit lines BL. The other end of each of the plurality of NAND strings NS is connected to a source line SL. Each of the plurality of NAND strings NS includes, for example, a plurality of memory cell transistors MT, a first selected transistor ST1, and a second selected transistor ST2. The NAND string NS includes, for example, 15 memory cell transistors MT0 to MT14.

The plurality of memory cell transistors MT are connected to each other in series. Each of the plurality of memory cell transistors MT includes, for example, a control gate and a charge storage film and stores data in a nonvolatile manner. Each of the plurality of memory cell transistors MT stores charge in the charge storage film in accordance with a voltage applied to the control gate. A control gate of each of the plurality of memory cell transistors MT is connected to any one of a plurality of word lines WL. In FIG. 2, 15 word lines WL0 to WL14 are shown. Each of the plurality of memory cell transistors MT is electrically connected to the row decoder 11 through a corresponding word line WL.

The first selected transistor ST1 is provided between the plurality of memory cell transistors MT and the corresponding bit line BL. A drain of the first selected transistor ST1 is connected to the bit line BL. A source of the first selected transistor ST1 is connected to the plurality of memory cell transistors MT. A control gate of the first selected transistor ST1 is connected to a corresponding selected gate line SGD. In FIG. 2, the selected gate line SGD corresponding to the control gate of the first selected transistor ST1 is any one of selected gate lines SGD0 to SGD2. The first selected transistor ST1 is connected to the row decoder 11 through the selected gate line SGD. The first selected transistor ST1 connects the NAND string NS and the bit line BL to each other when a predetermined voltage is applied to the selected gate line SGD.

The second selected transistor ST2 is provided between the plurality of memory cell transistors MT and the source line SL. A drain of the second selected transistor ST2 is connected to the plurality of memory cell transistors MT. A source of the second selected transistor ST2 is connected to the source line SL. A control gate of the second selected transistor ST2 is connected to a selected gate line SGS. The second selected transistor ST2 is connected to the row decoder 11 through the selected gate line SGS. The second selected transistor ST2 connects the NAND string NS and the source line SL to each other when a predetermined voltage is applied to the selected gate line SGS.

<Overall Configuration of Memory Cell Array>

Each of the plurality of string units SU extends in the Y-direction. In the X-direction, the plurality of string units SU are separated from each other by a slit SLT filled with an insulating material.

Figure 3:
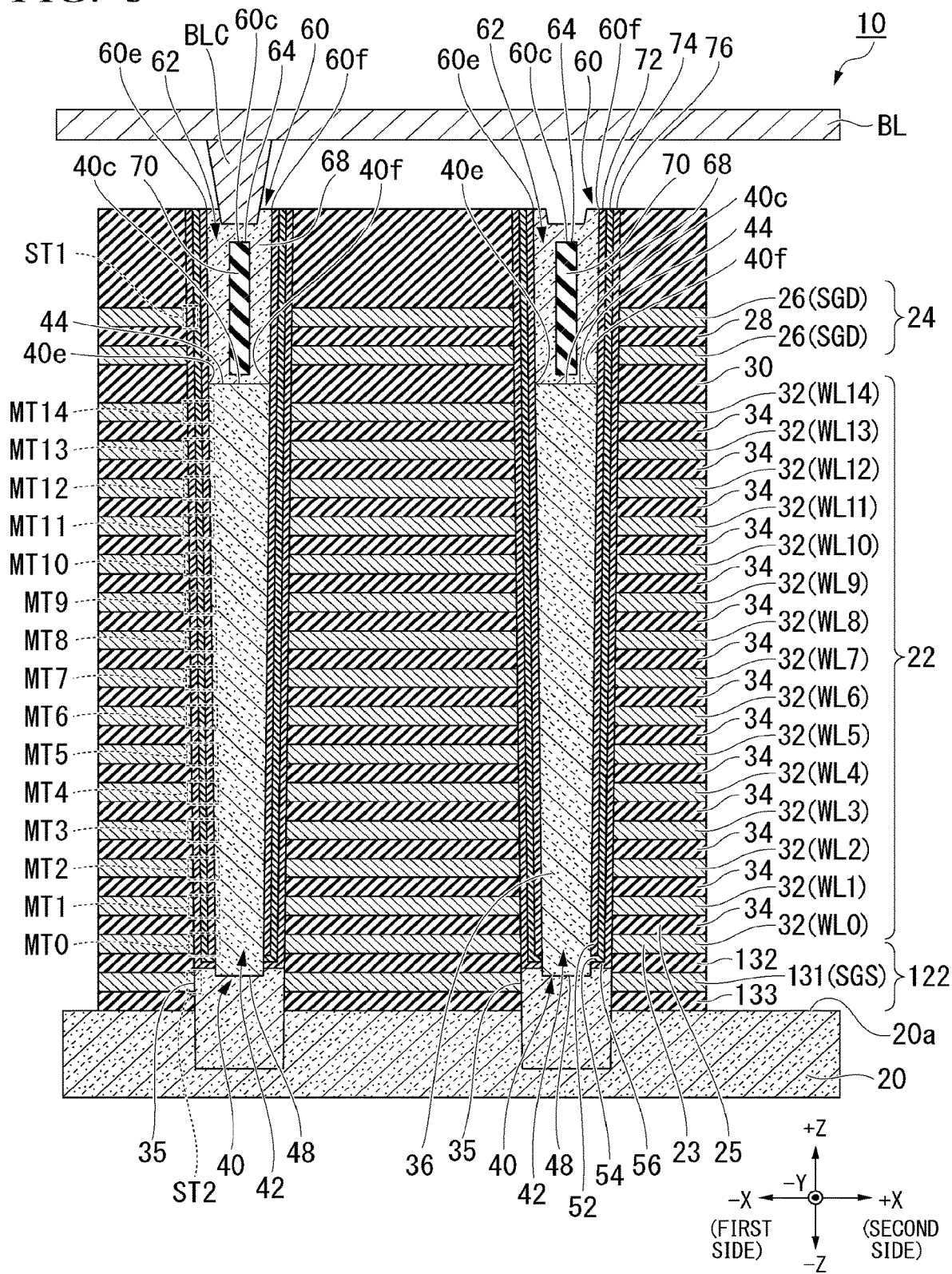
FIG. 3 is a partial cross-sectional view of the memory cell array of the semiconductor memory device of the first embodiment.

FIG. 3 is a cross-sectional view of a portion of the memory cell array 10 of the semiconductor memory device 1 of the first embodiment. The memory cell array 10 includes, for example, a silicon substrate 20, a first stack 22, a second stack 24, a first pillar 40, a first insulating film 52, a first charge storage film 54, a second insulating film 56, a second pillar 60, a third stack 122, a third insulating film 72, a second charge storage film 74, a fourth insulating film 76, a third insulating layer 30, a contact plug BLC, and a bit line BL. FIG. 3 shows two first columnar bodies 40, two second columnar bodies 60, and a contact plug BLC and a bit line BL connected to one second pillar 60.

The first stack 22 is provided on the surface 20a of the silicon substrate 20. The first stack 22 includes, for example, a plurality of first conductive layers 23 and a plurality of first insulating layers 25. The plurality of first conductive layers 23 include a conductive layer 31 and at least one conductive layer 32 and includes, for example, a plurality of conductive layers 32. The plurality of first insulating layers 25 include at least one insulating layer 34 and includes, for example, a plurality of insulating layers 34. The conductive layers 31 and 32 and the insulating layer 34 are alternately stacked in the Z-direction.

The conductive layer 31 is provided closest to the −Z side in the first stack 22 and functions as the selected gate line SGS. The plurality of conductive layers 32 function as the word lines WL0 to WL14. The conductive layer 31 and each of the plurality of conductive layers 32 are formed to have a plate shape in the X-direction and the Y-direction. The conductive layer 31 and each of the plurality of conductive layers 32 are formed of, for example, tungsten (W).

The insulating layer 34 is provided between the conductive layer 31 and the conductive layer 32 provided closest to the silicon substrate 20 in the −Z-direction among the plurality of conductive layers 32 in the Z-direction and between two conductive layers 32 adjacent to each other in the Z-direction. Each of the plurality of insulating layers 34 is formed to have a plate shape in the X-direction and the Y-direction. The insulating layer 34 is formed of, for example, silicon oxide ($SiO_2$).

Each of two first columnar bodies 40 extends inside the first stack 22 in the Z-direction. Each of the two first columnar bodies 40 extends in the X-direction and the Y-direction toward the +Z-direction.

Each of the two first columnar bodies 40 includes a first channel portion 42. The first channel portion 42 extends inside the first stack 22 in the Z-direction and is adjacent to the plurality of conductive layers (the plurality of first conductive layers) 32 in the X-direction. The first channel portion 42 functions as a channel of a transistor constituting the NAND string NS.

Each of the two first columnar bodies 40 includes, for example, a first end 40e and a second end 40f. The first end 40e is an end which is adjacent to a plurality of conductive layers 32 on a first side in the X-direction in each of the two first columnar bodies 40. The X-direction is an example of a second direction intersecting the Z-direction. The second end 40f is an end which is adjacent to a plurality of conductive layers 32 on a second side opposite to the first side in the X-direction in each of the two first columnar bodies 40. In FIG. 3, the first end 40e and the second end 40f in the X-direction seen from the Y-direction are shown. When seen in the −Z-direction, the first channel portion 42 includes, for example, a first semiconductor portion 48 in a region 44 including a center 40c equidistant from the first end 40e and the second end 40f. The first semiconductor portion 48 includes a first semiconductor of single-crystal. The first semiconductor of single-crystal includes, for example, single-crystal silicon, single-crystal silicon germanium (SiGe), single-crystal germanium (Ge), or a single-crystal III-V semiconductor such as gallium arsenide (GaAs) or indium gallium arsenide (InGaAs).

Each of the two first columnar bodies 40 includes semiconductor portions 35 and 36. The semiconductor portion 35 is adjacent to the silicon substrate 20 in the Z-direction and is an example of a first portion. The semiconductor portion 36 extends to a side opposite to the silicon substrate 20 in the Z-direction from the semiconductor portion 35 and is an example of a second portion. Each of the semiconductor portions 35 and 36 includes a first semiconductor of single-crystal. In the X-direction, the semiconductor portion 36 has a maximum width smaller than the minimum width of the semiconductor portion 35 in the X-direction. In other words, the minimum width of the semiconductor portion 35 in the X-direction is smaller than the maximum width of the semiconductor portion 36 in the X-direction.

The first insulating film 52 is provided between each of the plurality of first conductive layers 23 and the first channel portion 42 in the X-direction. The first insulating film 52 applies a current generated by the first channel portion 42 by a tunnel effect to the first charge storage film 54. The first insulating film 52 is formed of, for example, silicon oxide or the like.

The first charge storage film 54 is provided between each of the plurality of first conductive layers 23 and the first insulating film 52 in the X-direction. The first charge storage film 54 stores charge in accordance with a voltage applied to a selected gate line SGD. The first charge storage film 54 is formed of an insulator such as silicon nitride.

The second insulating film 56 is provided between each of the plurality of first conductive layers 23 and the first charge storage film 54 in the X-direction. A phenomenon in which charge is moved from the plurality of first conductive layers 23 to the first charge storage film 54 or the first channel portion 42 is prevented. The second insulating film 56 is formed of, for example, silicon oxide, aluminum oxide, zirconium oxide, or the like.

In the Z-direction, the semiconductor portion 35 is provided between each of the two first columnar bodies 40 and the silicon substrate 20. The semiconductor portion 35 is in contact with the first channel portion 42 and in contact with the first semiconductor portion 48 in the Z-direction. The semiconductor portion 35 includes the same material as that of the first semiconductor portion 48 and is formed of, for example, single-crystal silicon.

The second stack 24 is provided on a side opposite to the silicon substrate 20 with respect to the first stack 22 in the Z-direction. The second stack 24 includes, for example, at least one second conductive layer 26 and at least one second insulating layer 28. The second stack 24 includes, for example, two second conductive layers 26. Each of the two second conductive layers 26 functions as a selected gate line SGD. Each of the two second conductive layers 26 is formed of, for example, tungsten. One second insulating layer 28 is formed, for example, silicon oxide.

Each of the two second columnar bodies 60 is a pillar connected to each of the two first columnar bodies 40 in the Z-direction. Each of the two second columnar bodies 60 extends inside the second stack 24 in the Z-direction. Each of the two second columnar bodies 60 extends in the X-direction and the Y-direction toward the +Z-direction. An end face of each of the two second columnar bodies 60 on a first side in the X-direction is positioned substantially in alignment with an end face of each of the two first columnar bodies 40 on a first side in the X-direction. An end face of each of the two second columnar bodies 60 on a second side in the X-direction is positioned substantially in alignment with an end face of each of the two first columnar bodies 40 on a second side in the X-direction.

Each of the two second columnar bodies 60 includes a second channel portion 62. The second channel portion 62 extends inside the second stack 24 in the Z-direction and is adjacent to the two second conductive layers 26 in the X-direction. The minimum length of the first channel portion 42 in the Z-direction is larger than the minimum length of the second channel portion 62 in the Z-direction.

Each of the two second columnar bodies 60 includes, for example, a third end 60e and a fourth end 60f. The third end 60e is an end which is adjacent to the two second conductive layers 26 on a first side in the X-direction in each of the two second columnar bodies 60. The fourth end 60f is an end which is adjacent to the two second conductive layers 26 on a second side in the X-direction in each of the two second columnar bodies 60. The second channel portion 62 includes, for example, an insulating portion 70. The insulating portion 70 serves as an axis including an insulator such as silicon oxide and is provided in a region 64 including a center 60c equidistant from the third end 60e and the fourth end 60f when seen in the −Z-direction.

Each of the two second columnar bodies 60 includes, for example, a second semiconductor portion 68 between the insulating portion 70 and the two second conductive layers 26 in the X-direction. The second semiconductor portion 68 is disposed on the outer circumference of the insulating portion 70 in view of the Z-direction. The second semiconductor portion 68 includes a second semiconductor of poly-crystal. The second semiconductor of poly-crystal includes, for example, polycrystalline silicon, polycrystalline silicon germanium (SiGe), polycrystalline germanium (Ge), or a polycrystalline III-V semiconductor such as gallium arsenide (GaAs) or indium gallium arsenide (InGaAs).

The third insulating film 72 is provided between each of the two second conductive layers 26 and the second channel portion 62. The third insulating film 72 is in contact with the first insulating film 52 in the Z-direction and is formed of a film integrally with the first insulating film 52. The third insulating film 72 includes the same material as that of the first insulating film 52 and is formed of, for example, silicon oxide or the like.

The second charge storage film 74 is provided between each of the two second conductive layers 26 and the third insulating film 72. The second charge storage film 74 is in contact with the first charge storage film 54 in the Z-direction and is formed of a film integrally with the first charge storage film 54. The second charge storage film 74 includes the same material as that of the first charge storage film 54 and is formed of an insulator such as silicon nitride.

The fourth insulating film 76 is provided between each of the two second conductive layers 26 and the second charge storage film 74. The fourth insulating film 76 is in contact with the second insulating film 56 in the Z-direction and is formed of a film integrally with the second insulating film 56. The fourth insulating film 76 includes the same material as that of the second insulating film 56 and is formed of, for example, silicon oxide, aluminum oxide, zirconium oxide, or the like.

The third stack 122 is provided between the silicon substrate 20 and the first stack 22 in the Z-direction. The third stack 122 includes, for example, a third conductive layer 131, a fourth insulating layer 132, and a fifth insulating layer 133. The fourth insulating layer 132 is provided between the third conductive layer 131 and the first stack 22 in the Z-direction. The fifth insulating layer 133 is provided between the third stack 122 and the silicon substrate 20. The minimum thickness of the fourth insulating layer 132 in the Z-direction is larger than the minimum thickness of one first insulating layer 25 included in the plurality of first insulating layers 25 in the Z-direction.

The third insulating layer 30 is provided between the plurality of first conductive layers 23 and at least one second conductive layer 26 in the Z-direction. The minimum thickness of the third insulating layer 30 in the Z-direction is larger than the maximum thickness of one insulating layer 34 included in the plurality of first insulating layers 25.

The contact plug BLC is in contact with the second channel portion 62 in the Z-direction. The bit line BL is in contact with the contact plug BLC in the Z-direction and extends in the X-direction. Each of the contact plug BLC and the bit line BL is formed of, for example, tungsten.

<Method of Manufacturing Memory Cell Array>

Next, a method of manufacturing the memory cell array 10 of the semiconductor memory device 1 will be briefly described. The method of manufacturing the memory cell array 10 of the semiconductor memory device 1 includes a first intermediate stack forming process, a hole forming process, a first semiconductor material supply process, a second intermediate stack forming process, a second semiconductor material supply process, and an insulating material supply process. Hereinafter, each of the over-described processes will be described in detail.

First, in the first intermediate stack forming process, first dummy layers 238 and first insulating layers 234 are alternately stacked on the surface 20a of the silicon substrate 20 in the Z-direction to form a first intermediate stack 240. The first dummy layer 238 is formed of, for example, silicon nitride. The first insulating layer 234 includes the same material as that of the first insulating layer 25 and is formed of, for example, silicon oxide. An insulating layer 230 is formed on a surface 240a of the first intermediate stack 240. The insulating layer 230 is formed of, for example, silicon oxide. The minimum thickness of the insulating layer 230 in the Z-direction is larger than the maximum thickness of the first dummy layer 238 in the Z-direction. The first intermediate stack 240 includes the third stack 122 and the first stack 22 in the Z-direction.

Subsequently, in the second intermediate stack forming process, a second intermediate stack 244 including at least one second dummy layer 258 and at least one second insulating layer 228 is formed on a surface 230a of the insulating layer 230. That is, the second intermediate stack 244 is formed on a side opposite to the silicon substrate 20 with respect to the first intermediate stack 240 in the Z-direction. An insulating layer 239 is formed on a surface 244a of the second intermediate stack 244. The insulating layer 239 is formed of, for example, silicon oxide. The minimum thickness of the insulating layer 239 in the Z-direction is larger than the maximum thickness of the first dummy layer 238 in the Z-direction.

Figure 4:
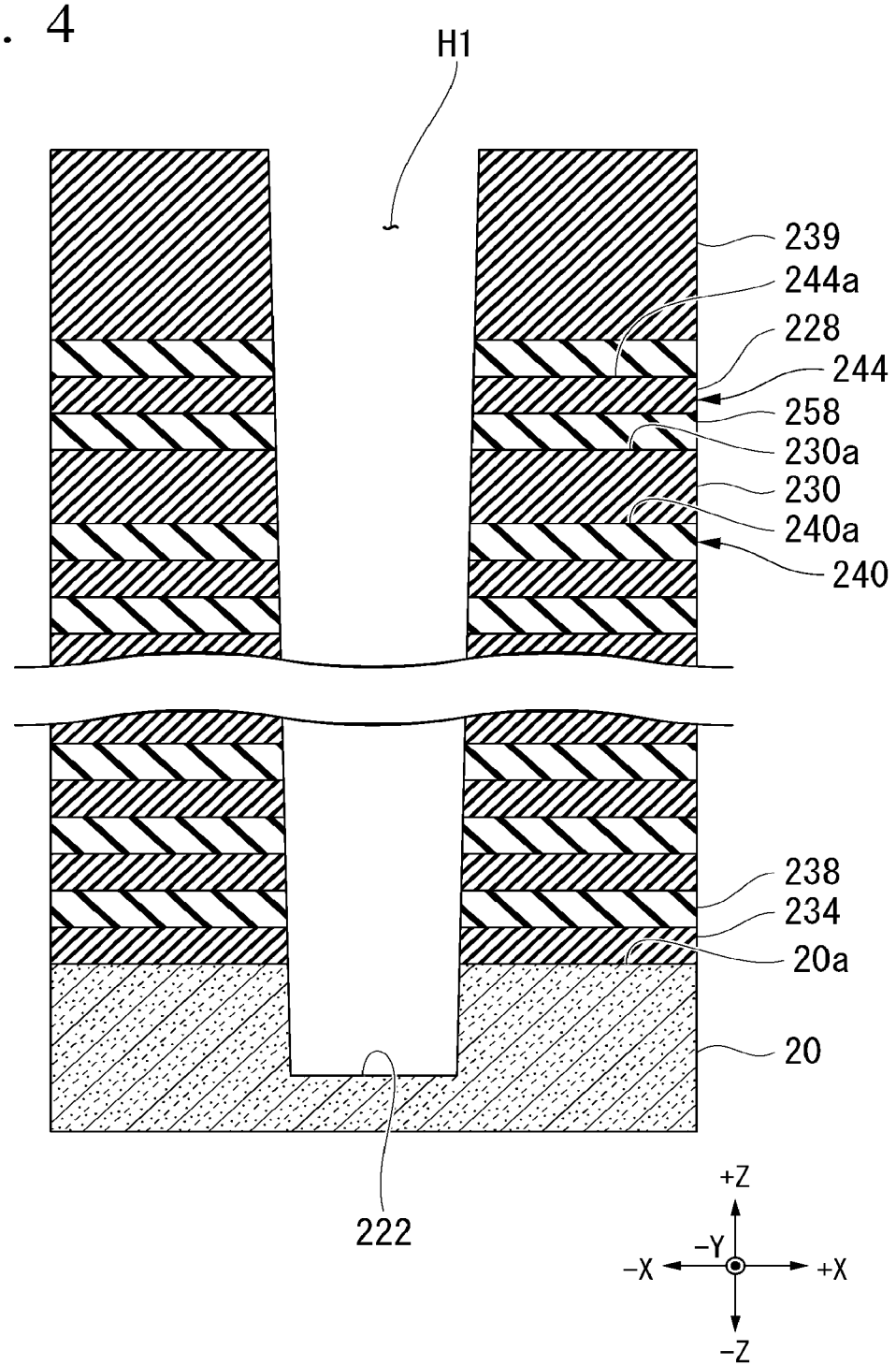
FIG. 4 is a cross-sectional view showing a step involved in a manufacturing process for the memory cell array shown in FIG. 3.

FIG. 4 is a cross-sectional view showing an example of a manufacturing process for the memory cell array 10 and showing a hole forming process. In the hole forming process, for example, a hole H1 extending in the Z-direction is formed in the first intermediate stack 240, the insulating layer 230, the second intermediate stack 244, and the insulating layer 239 as shown in FIG. 4 through patterning, etching, and the like. The hole H1 serves as both a first hole extending in the Z-direction in the first intermediate stack 240 and a second hole extending in the Z-direction in the second intermediate stack 244 so as to be connected to the first hole in substantially the entirety thereof (at least a portion) in the X-direction. In other words, in the manufacture of the semiconductor memory device 1, the first hole and the second hole are formed in the same process.

Figure 5:
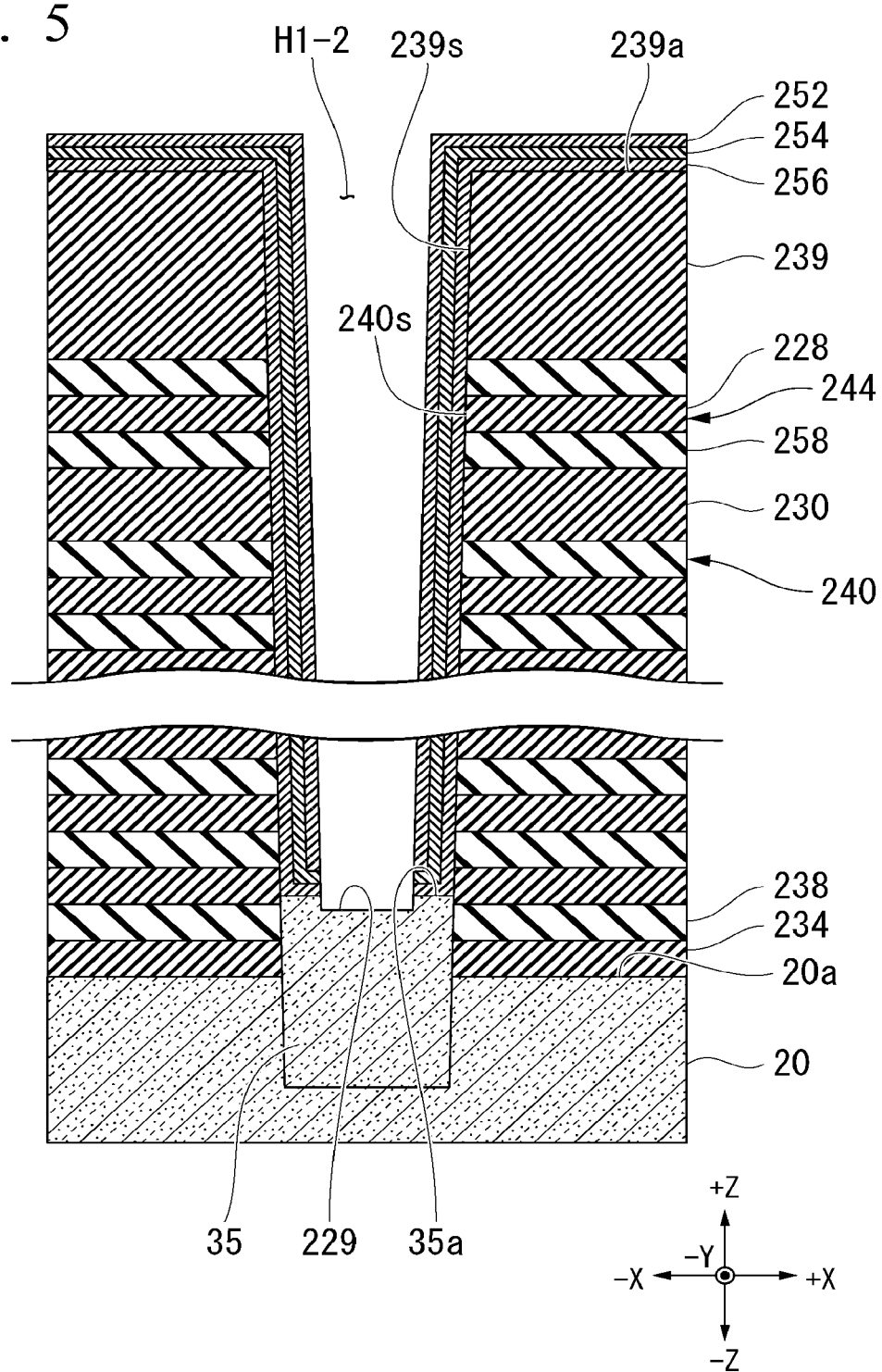
FIG. 5 is a cross-sectional view showing a step involved in the manufacturing process for the memory cell array shown in FIG. 3.

FIG. 5 is a cross-sectional view showing an example of a manufacturing process for the memory cell array 10. The bottom face of the hole H1 is positioned forward in the −Z-direction from the surface 20a of the silicon substrate 20. That is, a concave portion 229 is formed in the surface 20a of the silicon substrate 20 by forming the hole H1. Subsequently, the semiconductor portion 35 is formed in the concave portion 229. A surface 35a of the semiconductor portion 35 is positioned forward in the +Z-direction from the surface 20a of the silicon substrate 20.

Subsequently, an insulating film 256, a semiconductor film 254, and an insulating film 252 are sequentially formed on a surface 239a of the insulating layer 239, and a side surface 239s of the insulating layer 239, a side surface 240s of the first intermediate stack 240, and a surface 235a of the semiconductor portion 235 which are exposed to the hole H1. The insulating film 256 includes the same material as that of the second insulating film 56. The semiconductor film 254 includes the same material as that of the first charge storage film 54. The insulating film 252 includes the same material as that of the first insulating film 52.

Subsequently, the insulating film 256, the semiconductor film 254, and the insulating film 252 on the surface 35a of the semiconductor portion 35 are removed, and the insulating film 256, the semiconductor film 254, and the insulating film 252 are separated from each other in the X-direction. A portion of the surface 35a being exposed is dug down into in the −Z-direction to form the concave portion 229. After the concave portion 229 is formed, a hole H1-2 extending in the Z-direction is formed.

Figure 6:
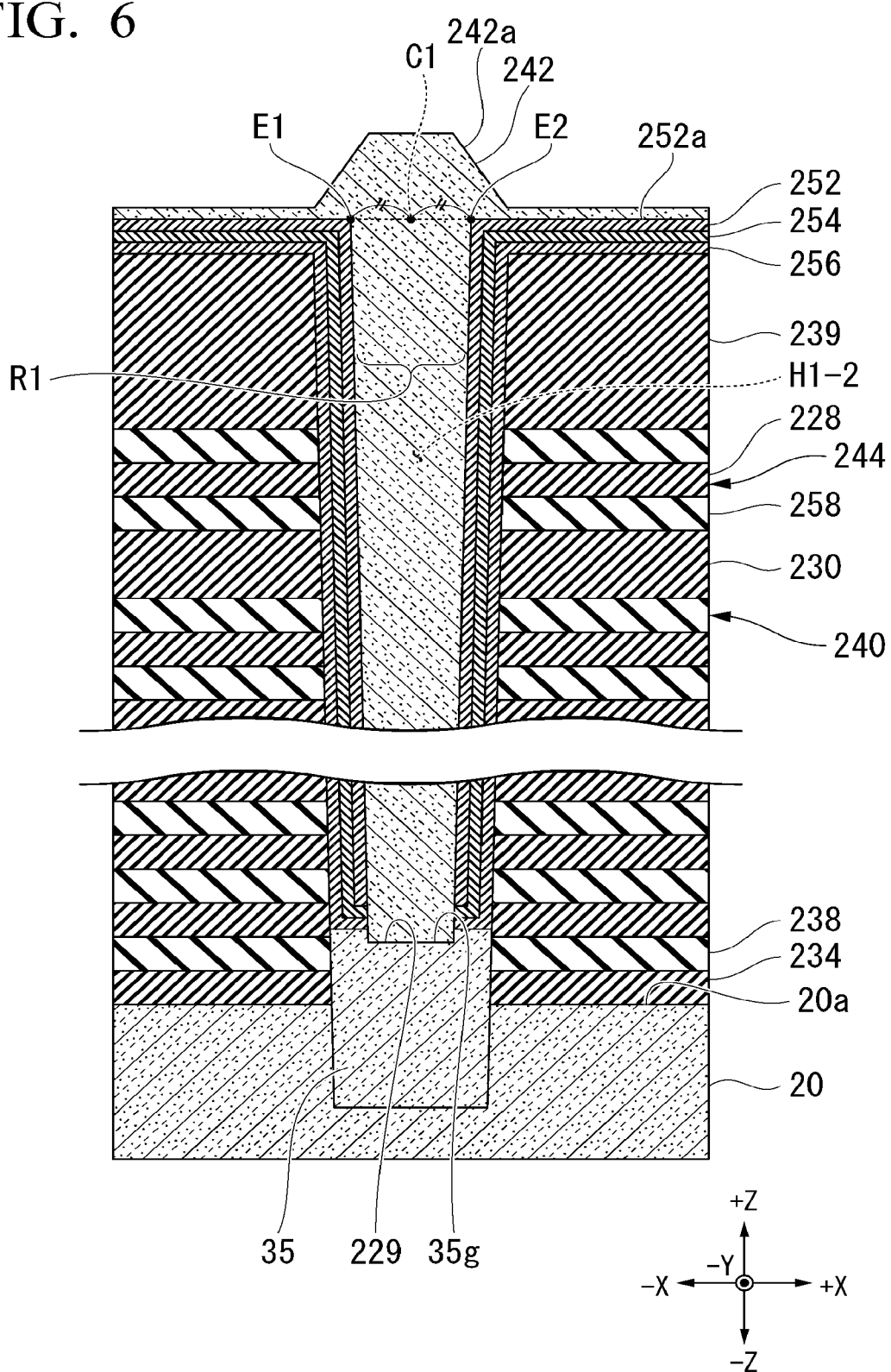
FIG. 6 is a cross-sectional view showing a step involved in the manufacturing process for the memory cell array shown in FIG. 3.

FIG. 6 is a cross-sectional view showing an example of a manufacturing process for the memory cell array 10 and showing a first semiconductor material supply process. In the first semiconductor material supply process, a first semiconductor of single-crystal is supplied to a first region R1 of the hole H1-2 in the Z-direction. The first region R1 includes a center C1 which is equidistant from a first end E1 of the hole H1-2 and a second end E2 of the hole H1-2 on a side opposite to the first end E1 in the X-direction. The first semiconductor of single-crystal includes the same material as that of the first semiconductor portion 48 and is, for example, single-crystal silicon. In detail, the first semiconductor of single-crystal is grown in the first region R1 in an epitaxial manner from a surface 35g of the semiconductor portion 35 which faces the concave portion 229 to form a semiconductor portion 242. A surface 242a of the semiconductor portion 242 is positioned forward from a surface 252a of the insulating film 252 in the +Z-direction. The semiconductor portion 242 in the first region R1 protrudes further in the +Z-direction than the semiconductor portion 242 in the vicinity of the first region R1 in the X-direction.

Figure 7:
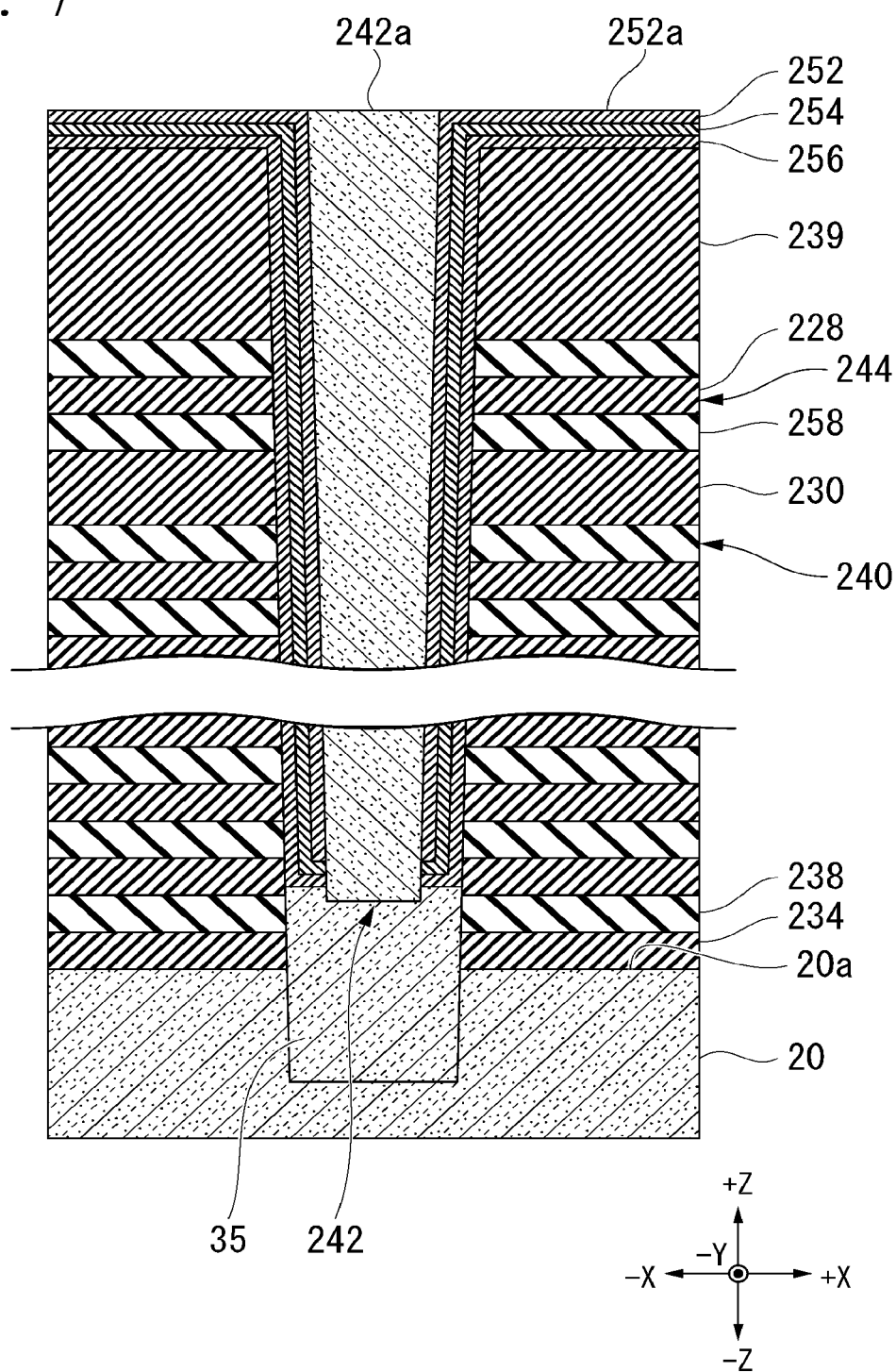
FIG. 7 is a cross-sectional view showing a step involved in the manufacturing process for the memory cell array shown in FIG. 3.

FIG. 7 is a cross-sectional view showing an example of a manufacturing process for the memory cell array 10 and showing a process of partially removing a first semiconductor material. For example, the semiconductor portion 242 is polished while being removed in the −Z-direction through chemical mechanical polishing (CMP), and the surface 242a of the semiconductor portion 242 is aligned on substantially the same plane as the surface 252a of the insulating film 252 in the Z-direction.

Figure 8:
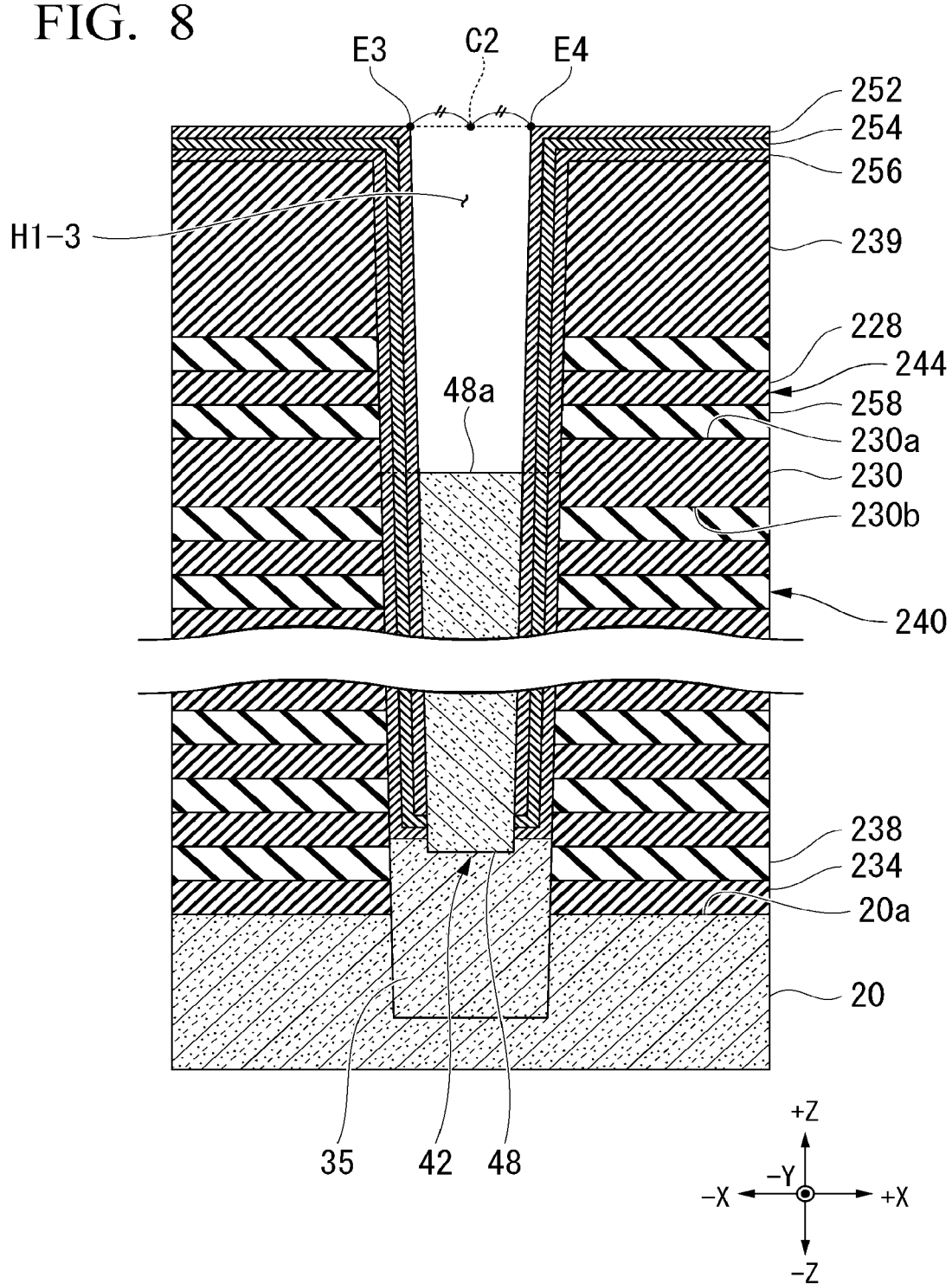
FIG. 8 is a cross-sectional view showing a step involved in the manufacturing process for the memory cell array shown in FIG. 3.

FIG. 8 is a cross-sectional view showing an example of a manufacturing process of the memory cell array 10 and showing a process of recessing a first semiconductor material. For example, the semiconductor portion 242 is recessed through dry etching so that the surface 242a of the semiconductor portion 242 is positioned in the Z-direction between the surface 230a of the insulating layer 230 in the +Z-direction and a surface 230b of the insulating layer 230 in the −Z-direction. The first semiconductor portion 48 constituting the first channel portion 42 is formed by recessing the semiconductor portion 242 as shown in FIG. 8. A hole H1-3 is formed further in the +Z-direction than the first semiconductor portion 48. The hole H1-3 extends in the Z-direction in the second intermediate stack 244, and at least a portion of the hole is connected to a first hole in the X-direction. The hole H1-3 is an example of a second hole.

Figure 9:
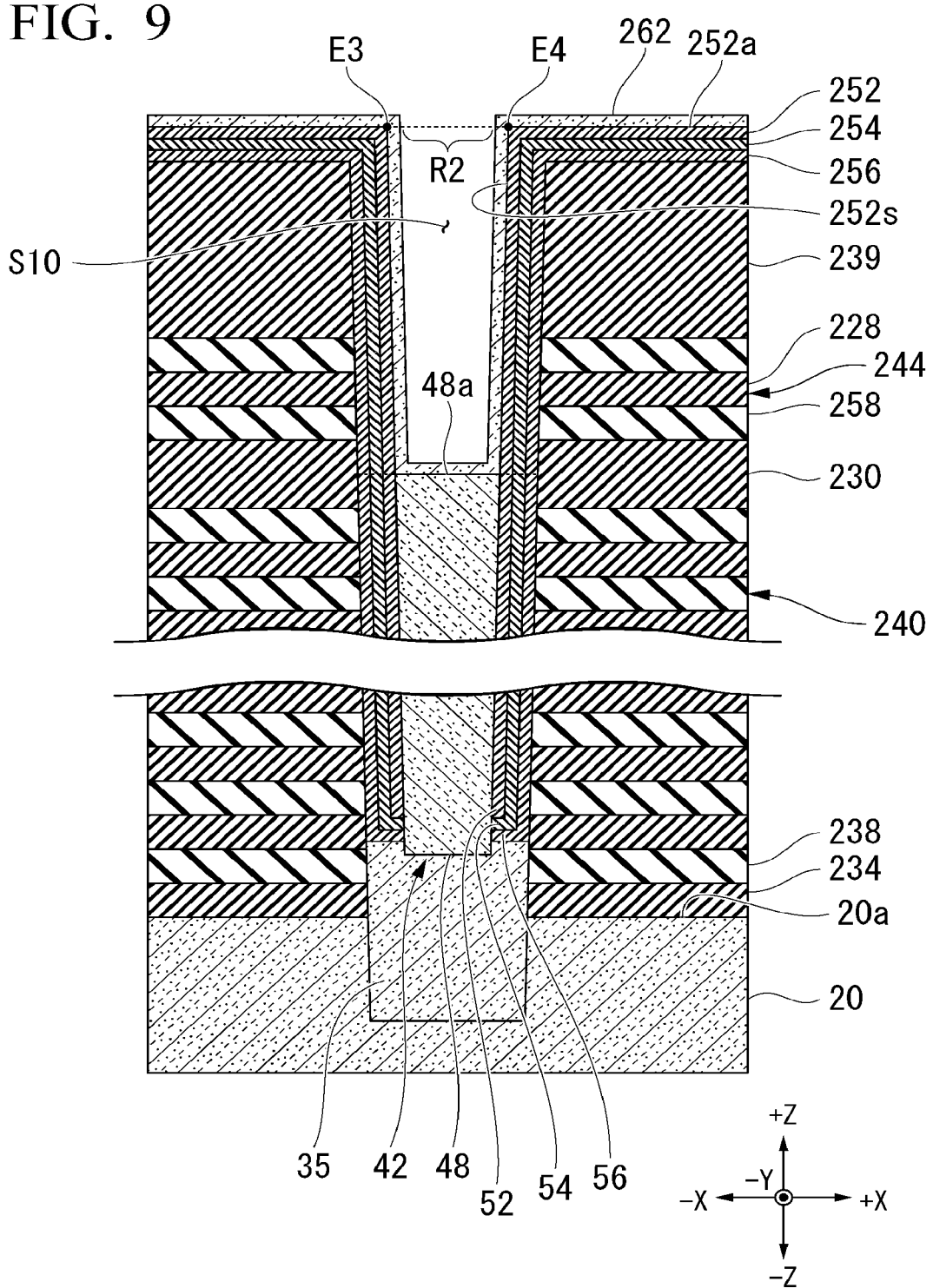
FIG. 9 is a cross-sectional view showing a step involved in the manufacturing process for the memory cell array shown in FIG. 3.

FIG. 9 is a cross-sectional view showing an example of a manufacturing process for the memory cell array 10 and showing a second semiconductor material supply process. In the second semiconductor material supply process, as shown in FIG. 9, a second semiconductor of poly-crystal is supplied between a second region R2, including a center C2 equidistant from a third end E3 of the hole H1-3 and a fourth end E4 on a side opposite to the third end of the second hole in the X-direction, and the second intermediate stack 244 in the Z-direction. In more detail, a semiconductor film 262 is formed in the surface 252a of the insulating film 252, and a side surface 252s of the insulating film 252 and a surface 48a of the first semiconductor portion 48 which are exposed to the hole H1-3. The semiconductor film 262 includes the same material as that of the second semiconductor portion 68, is formed of a second semiconductor of poly-crystal, and is formed of, for example, polycrystalline silicon.

Subsequently, although not shown in the drawing, an insulating material is supplied to the second region R2 in the Z-direction. The insulating material includes the same material as that of the insulating portion 70. The insulating material is recessed in the −Z-direction, and a second semiconductor of poly-crystal is supplied to the second region R2 in the +Z-direction rather than an insulating material.

The insulating film 252, the semiconductor film 254, and the insulating film 256 in the −Z-direction from positions overlapping the surface 48a of the first semiconductor portion 48 in the Z-direction function as the first insulating film 52, the first charge storage film 54, and the second insulating film 56, respectively. The insulating film 252, the semiconductor film 254, and the insulating film 256 in the +Z-direction from positions overlapping the surface 48a of the first semiconductor portion 48 in the Z-direction function as the third insulating film 72, the second charge storage film 74, and the fourth insulating film 76, respectively.

Subsequently, although not shown in the drawing, the plurality of first dummy layers 238 of the first intermediate stack 240 and the plurality of second dummy layers 258 of the second intermediate stack 244 are removed using, for example, a chemical solution or the like. A conductive material including the same material as that of the first conductive layer 23 is supplied to a region from which each of the first dummy layers 238 is removed. A conductive material including the same material as that of the second conductive layer 26 is supplied to a region from which each of the second dummy layers 258 is removed.

The memory cell array 10 shown in FIG. 3 can be manufactured by proceeding with the over-described processes. The semiconductor memory device 1 is formed by performing known pre-processing before the over-described processes and performing known post-processing after the over-described processes. However, the method of manufacturing the semiconductor memory device 1 is not limited to the over-described method.

Operational effects of the semiconductor memory device 1 of the first embodiment described over will be described. In the semiconductor memory device of the related art, a polycrystalline semiconductor material is used for a material of a channel portion. The polycrystalline semiconductor material includes, for example, polycrystalline silicon. The polycrystalline semiconductor material has a plurality of defect levels at grain boundaries, and the like. The polycrystalline semiconductor material has a plurality of defect levels, which results in a deterioration in electrical characteristics. The semiconductor memory device 1 of the first embodiment includes the first semiconductor portion 48 including a first semiconductor of single-crystal with a defect level of hardly any defects in the region 44 including the center 40c equidistant from the first end 40e and the second end 40f when seen in the Z-direction. The first channel portion 42 is formed of a first semiconductor of single-crystal with a defect level of hardly any defects, so that variations in a threshold voltage of a plurality of memory cell transistors MT are suppressed. Therefore, according to the semiconductor memory device 1, electrical characteristics can be improved.

The semiconductor memory device 1 of the first embodiment includes the insulating portion 70 in the region 64 including the center 60c equidistant from the third end 60e and the fourth end 60f when seen in the −Z-direction. The semiconductor memory device 1 includes the second semiconductor portion 68 including a second semiconductor of poly-crystal between the insulating portion 70 and the two second conductive layers 26 functioning as a selected gate line SGD in the X-direction. Since the second channel portion 62 adjacent to the selected gate line SGD in the X-direction has a thin film channel having a hollow structure, the second channel portion includes a second semiconductor of poly-crystal, but a deterioration in cut-off characteristics is suppressed and the occurrence of a defective operation of the selected gate line SGD is prevented. Therefore, according to the semiconductor memory device 1, electrical characteristics can be improved.

Second Embodiment

Next, a configuration of a semiconductor memory device according to a second embodiment will be described. Although not shown in the drawing, the semiconductor memory device of the second embodiment is a NAND flash memory, similar to the semiconductor memory device 1 of the first embodiment. Hereinafter, with regard to components of the semiconductor memory device of the second embodiment, only contents different from those of the components of the semiconductor memory device 1 will be described, and a detailed description of contents which are common to those of the components of the semiconductor memory device 1 will be omitted.

Figure 10:
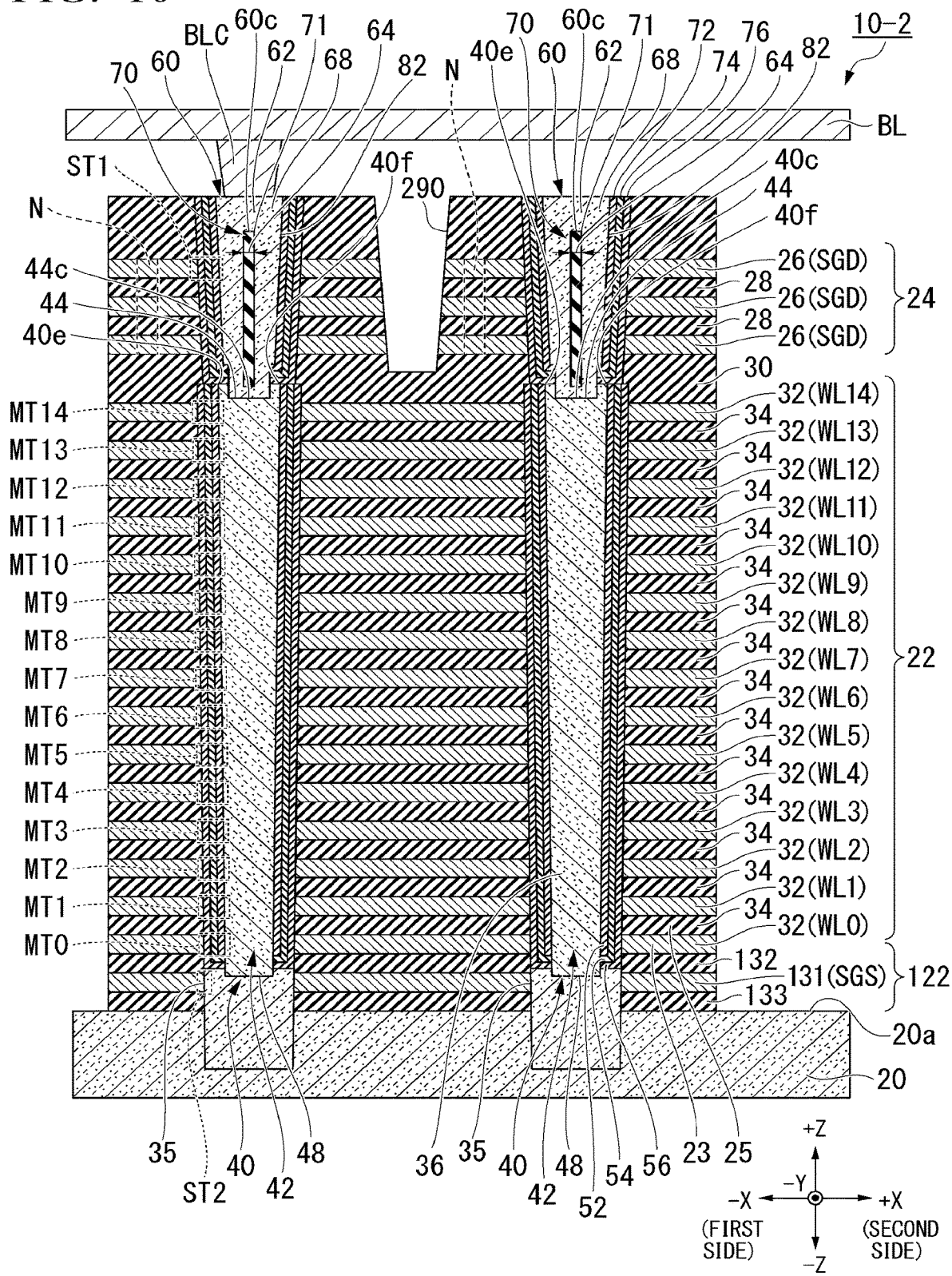
FIG. 10 is a partial cross-sectional view of a memory cell array of a semiconductor memory device of a second embodiment.

FIG. 10 is a cross-sectional view of a portion of a memory cell array 10-2 of the semiconductor memory device of the second embodiment. As shown in FIG. 10, a second stack 24 includes, for example, three second conductive layers 26. When seen in the −Z-direction, for example, a silicon oxide film is provided in a region 64 including a center 60c as an insulating portion 70. A gap not shown in the drawing may remain in the silicon oxide film. Each of two second columnar bodies 60 includes a third insulating film 72, a second charge storage film 74, and a fourth insulating film 76 similar to the first embodiment. However, the third insulating film 72 is formed as a film different from a first insulating film 52. The second charge storage film 74 is formed as a film different from a first charge storage film 54. The fourth insulating film 76 is formed as a film different from a second insulating film 56. In the second embodiment, a stacked film of the third insulating film 72, the second charge storage film 74, and the fourth insulating film 76 functions as an insulating portion.

The three second conductive layers 26 and at least one or more second insulating layers 28 between the two second columnar bodies 60 in the X-direction are separated from each other in the X-direction by a groove 290 extending in the Z-direction. The groove 290 is provided with an insulator not shown in the drawing. The three second conductive layers 26 on a first side of each of the two second columnar bodies 60 in the X-direction may be separated from each other in the X-direction.

Next, a method of manufacturing the memory cell array 10-2 of the semiconductor memory device of the second embodiment will be briefly described. The method of manufacturing the memory cell array 10-2 of the semiconductor memory device of the second embodiment includes a first intermediate stack forming process, a first hole forming process, a first semiconductor material supply process, a second intermediate stack forming process, a second hole forming process, a second semiconductor material supply process, and an insulating material supply process.

First, although not shown in the drawing, first dummy layers 238 and first insulating layers 234 are alternately stacked on the surface 20a of the silicon substrate 20 in the Z-direction to form a first intermediate stack 240 in the first intermediate stack forming process described in the first embodiment. Subsequently, a first hole extending in the Z-direction is formed in a first intermediate stack 240 and an insulating layer 230 in the first hole forming process without performing the second intermediate stack forming process. Thereafter, as described in the first embodiment, a semiconductor portion 35, a first insulating film 52, a first charge storage film 54, a second insulating film 56, and a first semiconductor portion 48 are formed in the first hole.

Figure 11:
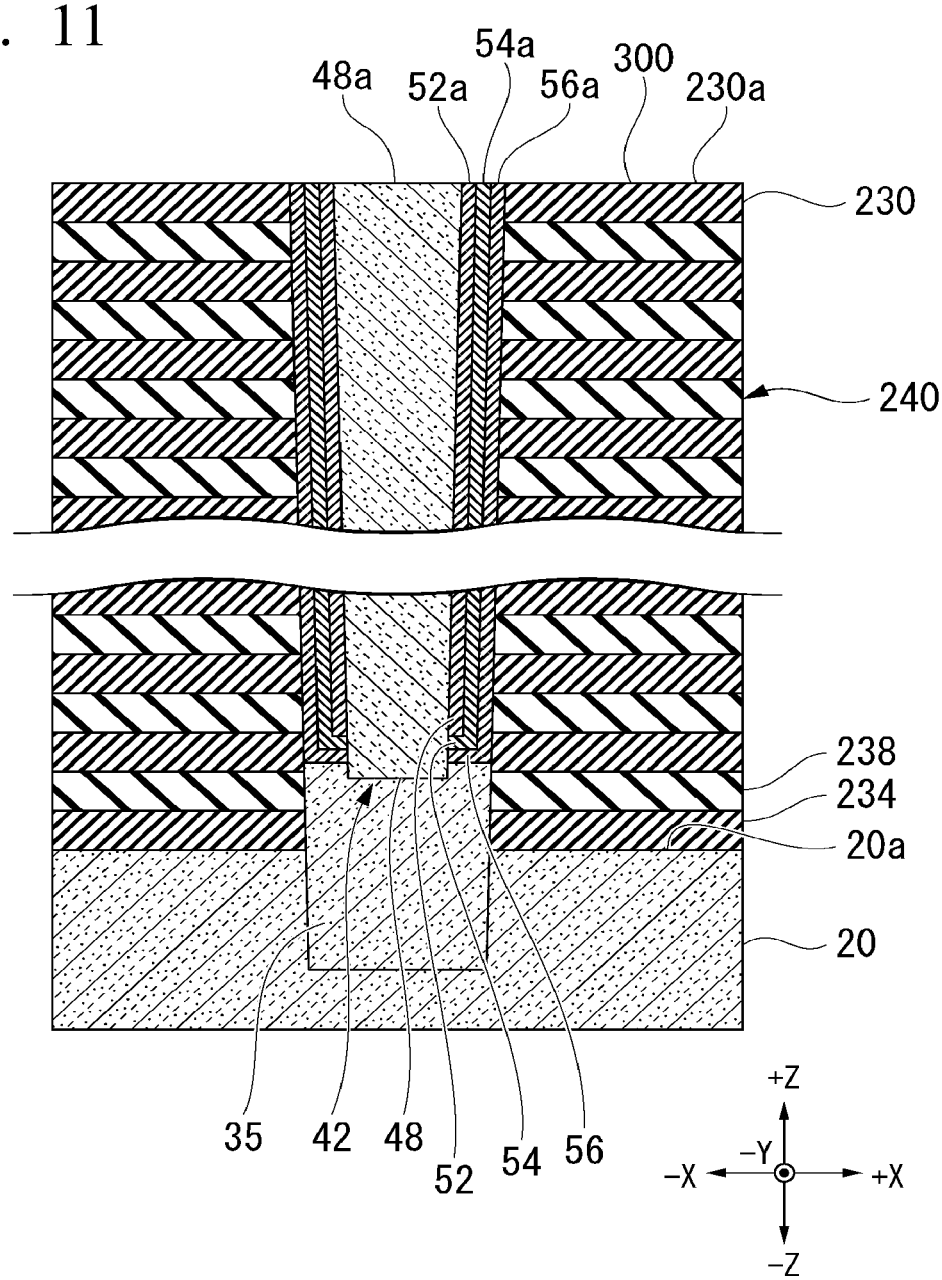
FIG. 11 is a cross-sectional view showing a step involved in a manufacturing process for the memory cell array shown in FIG. 10.

FIG. 11 is a cross-sectional view showing an example of a manufacturing process for the memory cell array 10-2 and showing a first plural material recessing process. In detail, the surface of a component after forming the first semiconductor portion 48 in the first hole is polished while being removed in the −Z-direction through, for example, CMP, and a surface 230a of the insulating layer 230, a surface 52a of the first insulating film 52 extending in the Z-direction, a surface 54a of the first charge storage film 54 extending in the Z-direction, a surface 56a of the second insulating film 56 extending in the Z-direction, and a surface 48a of the first semiconductor portion 48 are aligned with each other on the same plane. The same plane is set to be a surface 300.

Figure 12:
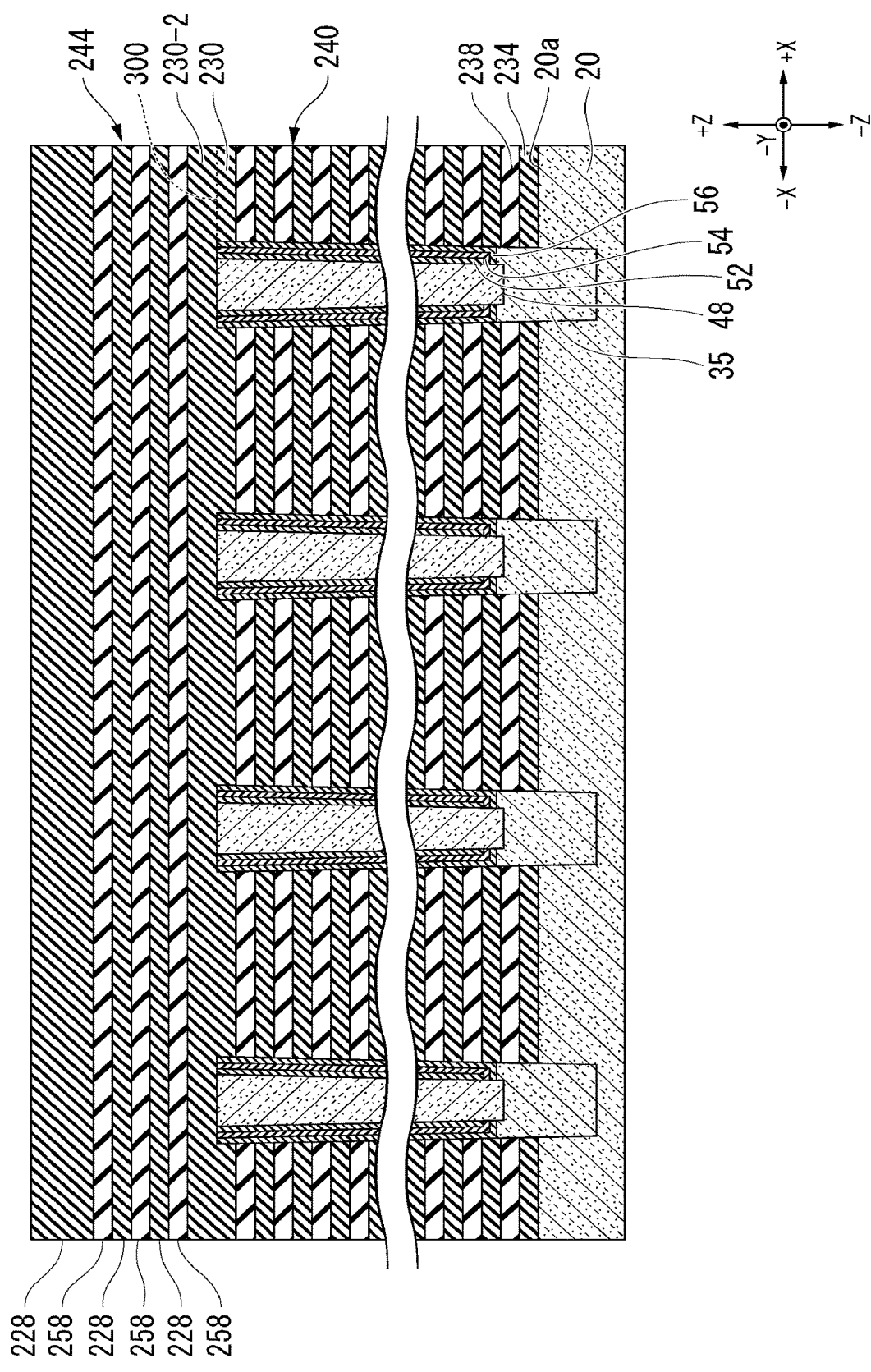
FIG. 12 is a cross-sectional view showing a step involved in the manufacturing process for the memory cell array shown in FIG. 10.

FIG. 12 is a cross-sectional view showing an example of a manufacturing process for the memory cell array 10-2 and showing a second intermediate stack forming process. In the second intermediate stack forming process, as shown in FIG. 12, a second intermediate stack 244 including three second dummy layers 258 and at least one second insulating layer 228 is formed on the surface 300.

Figure 13:
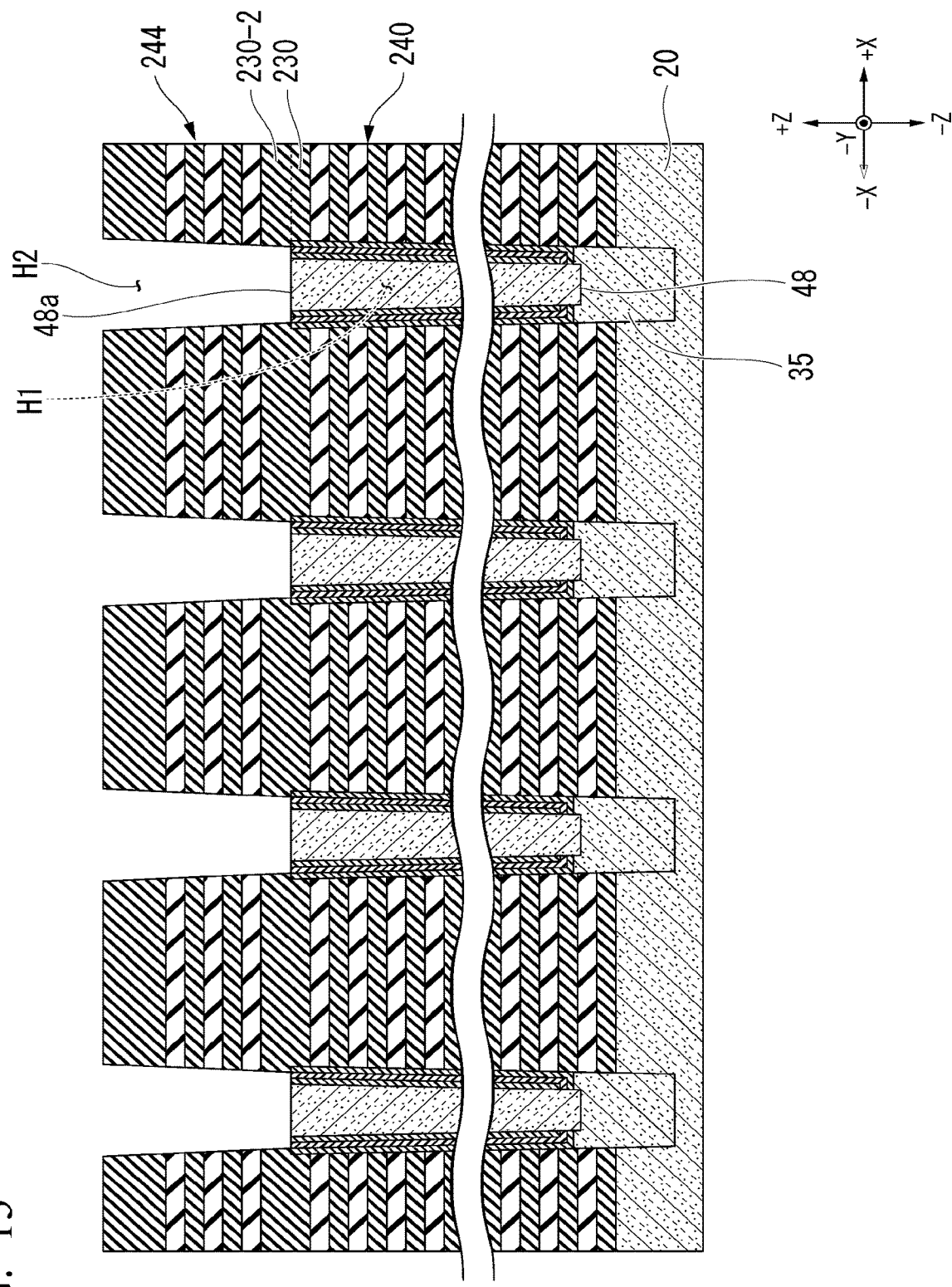
FIG. 13 is a cross-sectional view showing a step involved in the manufacturing process for the memory cell array shown in FIG. 10.

FIG. 13 is a cross-sectional view showing an example of a manufacturing process for the memory cell array 10-2 and showing a second hole forming process. In the second hole forming process, as shown in FIG. 13, a second hole H2 extending in the Z-direction is formed in the second intermediate stack 244. At least a portion of the second hole H2 is connected to a first hole H1 and the first semiconductor portion 48 in the X-direction. That is, in the second embodiment, the first hole H1 and the second hole H2 are formed in different processes.

Figure 14:
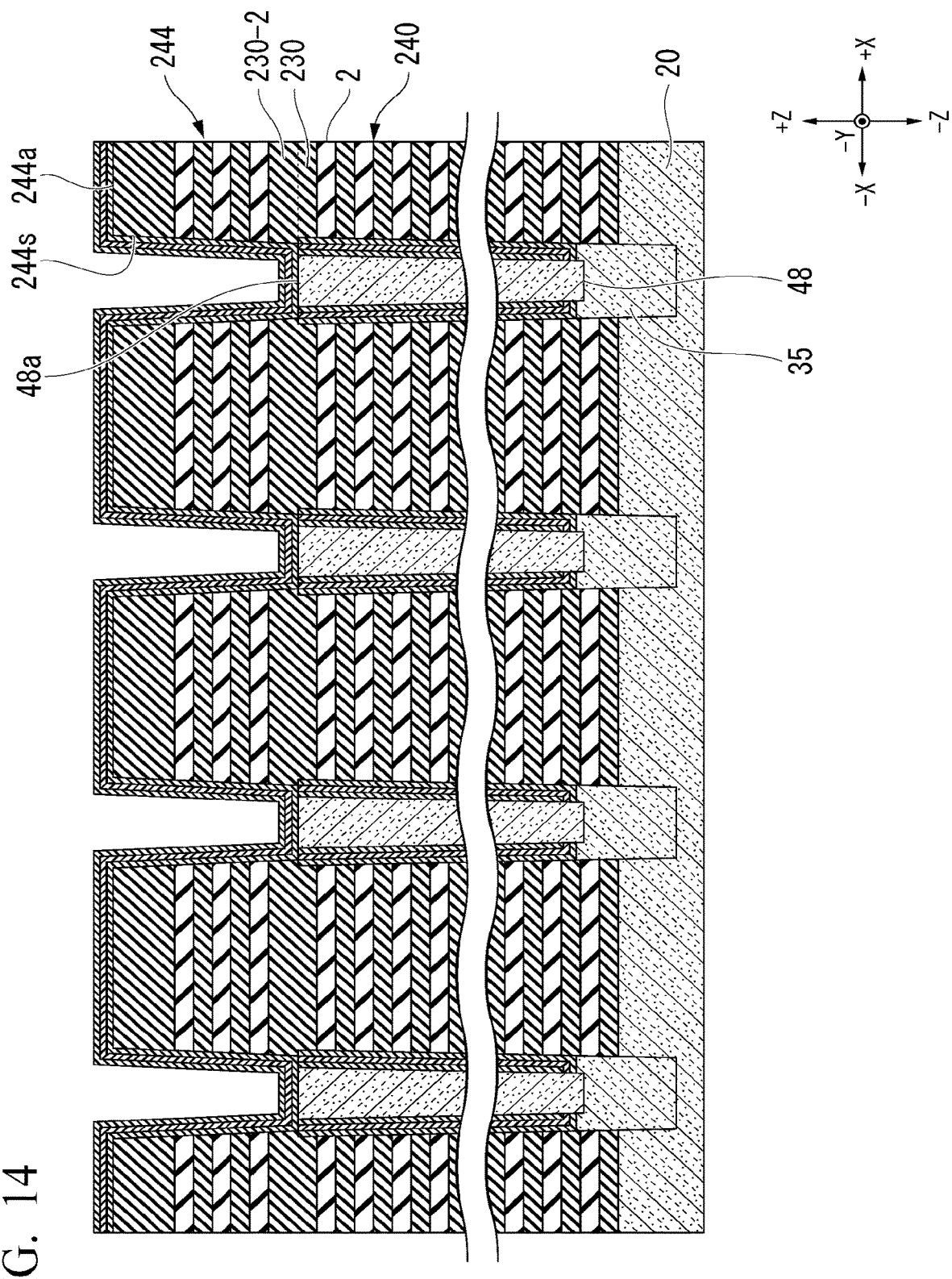
FIG. 14 is a cross-sectional view showing a step involved in the manufacturing process for the memory cell array shown in FIG. 10.

FIG. 14 is a cross-sectional view showing an example of a manufacturing process for the memory cell array 10-2. Subsequently, an insulating film 286, a semiconductor film 284, and an insulating film 282 are sequentially formed in a surface 244a of the second intermediate stack 244, and a side surface 244s of the second intermediate stack 244, a surface 48a of the first semiconductor portion 48, and the like which are exposed to the hole H2. The insulating film 286 includes the same material as that of the fourth insulating film 76. The semiconductor film 284 includes the same material as that of the second charge storage film 74. The insulating film 282 includes the same material as that of the third insulating film 72.

Figure 15:
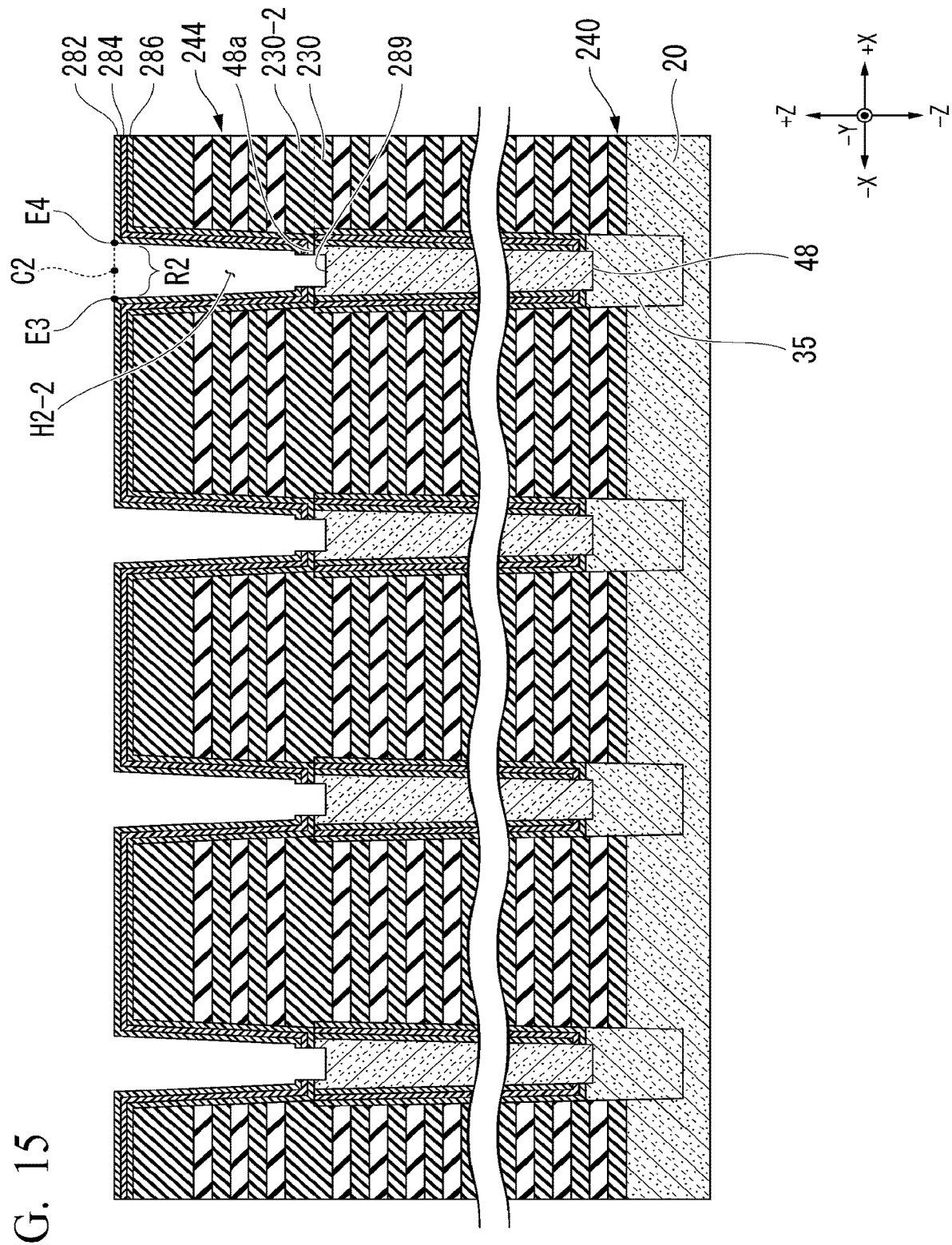
FIG. 15 is a cross-sectional view showing a step involved in the manufacturing process for the memory cell array shown in FIG. 10.

FIG. 15 is a cross-sectional view showing an example of a manufacturing process for the memory cell array 10-2. Subsequently, the insulating film 286, the semiconductor film 284, and the insulating film 282 on the surface 48a of the first semiconductor portion 48 are removed, and the insulating film 286, the semiconductor film 284, and the insulating film 282 are separated from each other in the X-direction. A portion of the exposed surface 48a of the first semiconductor portion 48 is dug down in the −Z-direction to form a concave portion 289. After the concave portion 289 is formed, a hole H2-2 extending in the Z-direction is formed.

Figure 16:
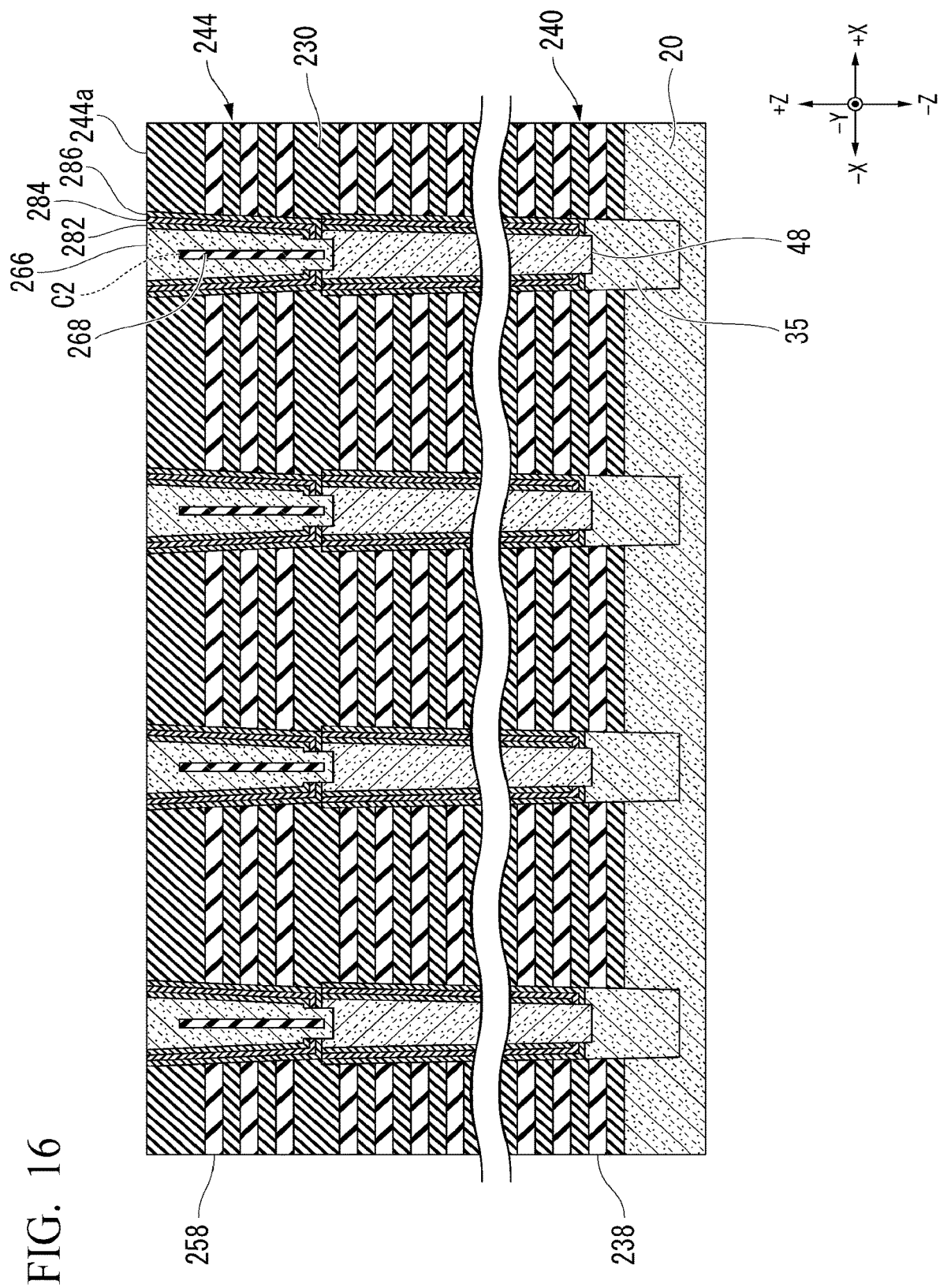
FIG. 16 is a cross-sectional view showing a step involved in the manufacturing process for the memory cell array shown in FIG. 10.

In the second semiconductor material supply process, as shown in FIG. 15, a second semiconductor of poly-crystal is supplied between a second region R2, including a center C2 equidistant from a third end E3 and a fourth end E4 of the hole H2-2 in the X-direction, and the second intermediate stack 244 in the Z-direction. FIG. 16 is a cross-sectional view showing an example of a manufacturing process for the memory cell array 10-2 and showing a second semiconductor material supply process. In detail, as shown in FIG. 16, a semiconductor portion 266 including a second semiconductor of poly-crystal is formed in the surface 244a of the second intermediate stack 244, and a side surface 282s of the insulating film 282 and the surface 48a of the first semiconductor portion 48 which are exposed to the hole H2-2.

Figure 17:
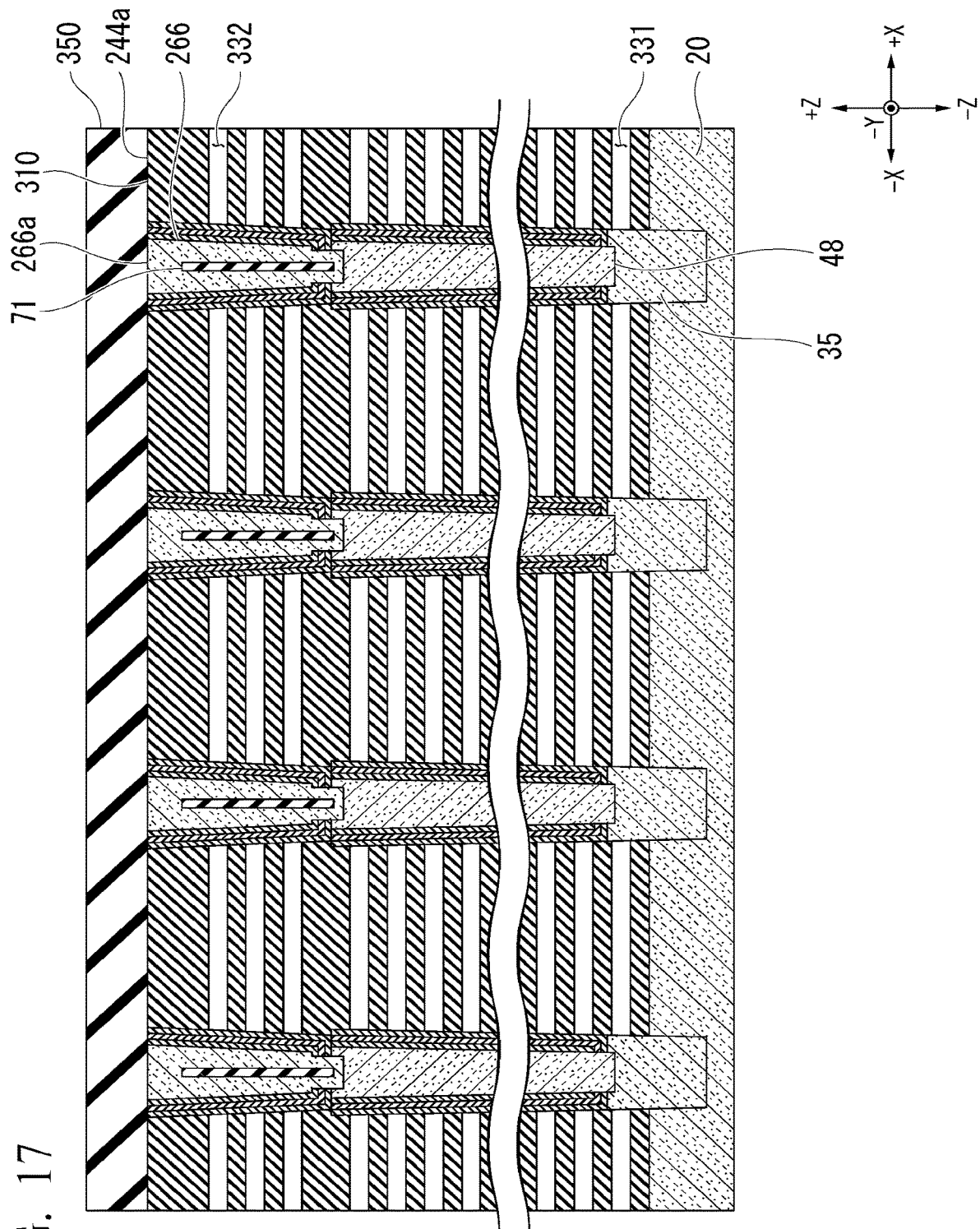
FIG. 17 is a cross-sectional view showing a step involved in the manufacturing process for the memory cell array shown in FIG. 10.

Subsequently, although not shown in the drawing, for example, a silicon oxide film is formed in the second region R2 inside the semiconductor portion 266 in the Z-direction as an insulating portion 71. A gap not shown in the drawing may remain in the silicon oxide film. FIG. 17 is a cross-sectional view showing an example of a manufacturing process for the memory cell array 10-2. As shown in FIG. 17, the surface of a component after forming the second semiconductor portion 68 is polished while being removed in the −Z-direction through, for example, CMP, and the surfaces of the second intermediate stack 244, the semiconductor portion 266, the insulating film 286, the semiconductor film 284, and the insulating film 282 are aligned with each other on the same plane. When the same plane is set to be a surface 310, an insulating interlayer 350 including silicon oxide or the like is formed on the surface 310.

Figure 18:
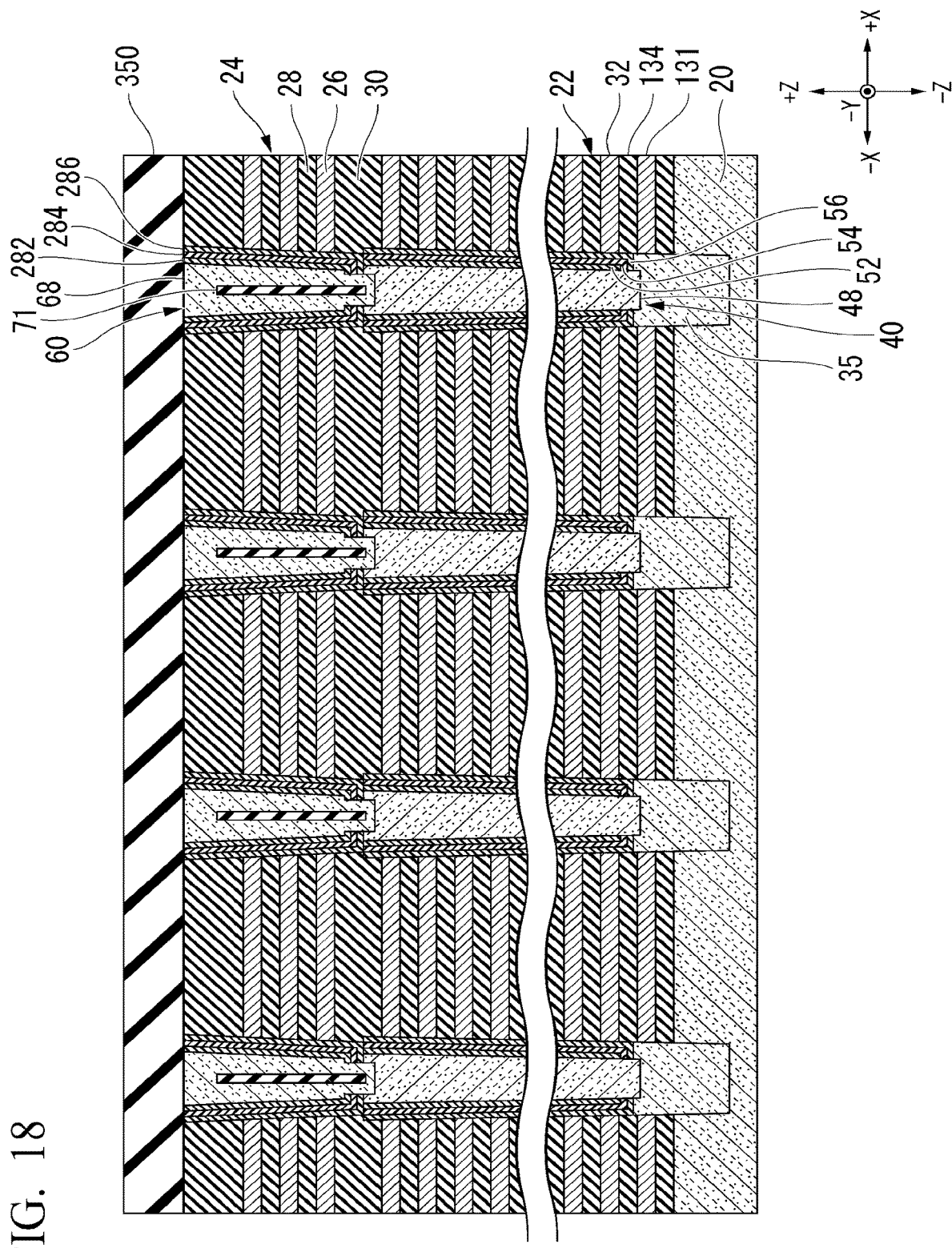
FIG. 18 is a cross-sectional view showing a step involved in the manufacturing process for the memory cell array shown in FIG. 10.

Subsequently, the plurality of first dummy layers 238 of the first intermediate stack 240 and the plurality of second dummy layers 258 of the second intermediate stack 244 are removed using, for example, a medicinal solution or the like. A conductive material including the same material as that of the first conductive layer 23 is supplied to a region 331 from which each of the first dummy layers 238 is removed. A conductive material including the same material as that of the second conductive layer 26 is supplied to a region 332 from which each of the second dummy layers 258 is removed. FIG. 18 is a cross-sectional view showing an example of a manufacturing process for the memory cell array 10-2 and showing components before the groove 290, a contact plug BLC, and a bit line BL shown in FIG. 10 are formed.

Figure 19:
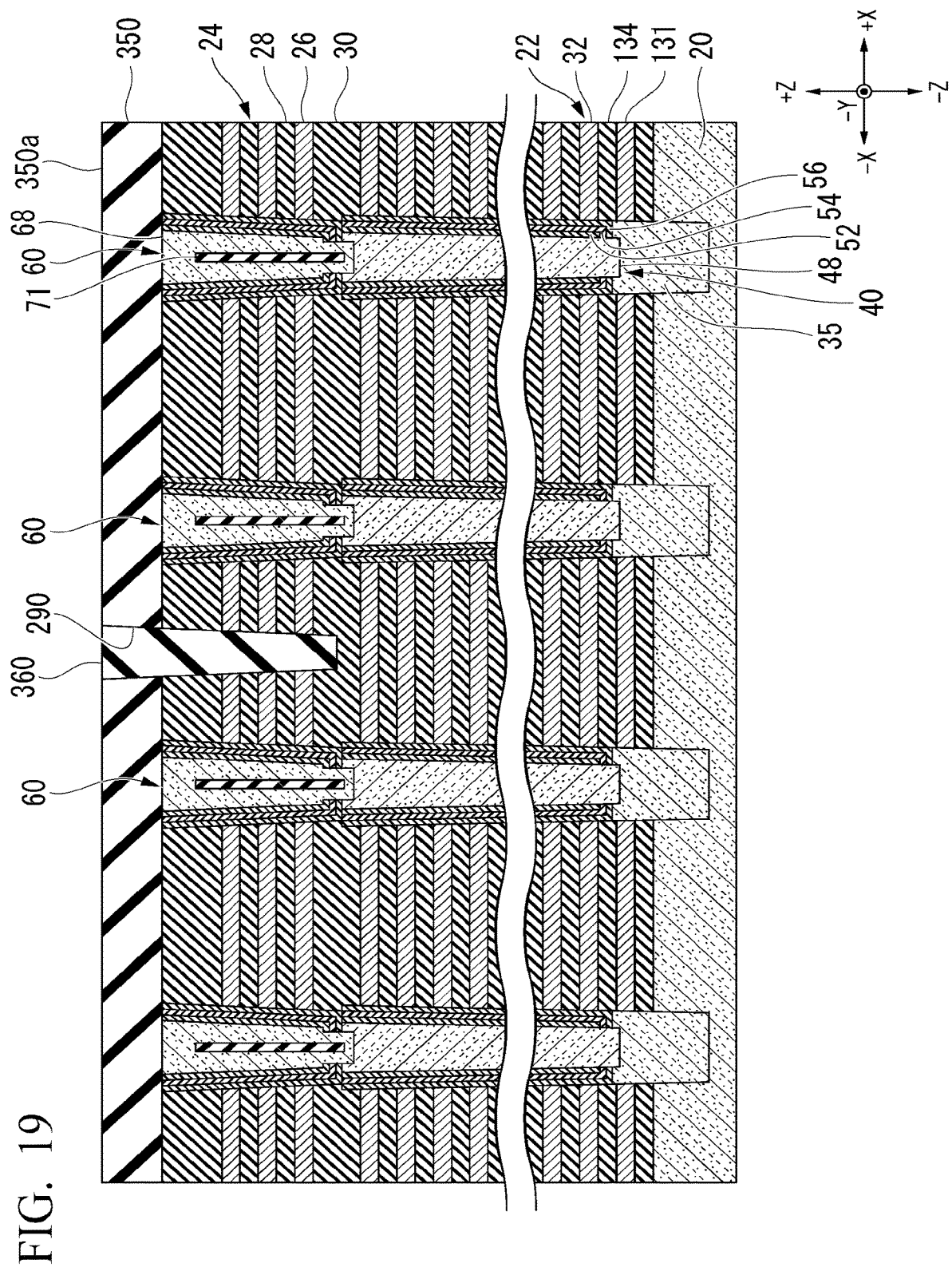
FIG. 19 is a cross-sectional view showing a step involved in the manufacturing process for the memory cell array shown in FIG. 10.

FIG. 19 is a cross-sectional view showing an example of a manufacturing process for the memory cell array 10-2 and showing an insulating slit forming process. As shown in FIG. 19, the groove 290 penetrating the second stack 24 in the Z-direction between two predetermined second columnar bodies 60 adjacent to each other in the X-direction, among the plurality of second columnar bodies 60, is formed. An insulating material such as silicon oxide is supplied to the groove 290, and the surface of the insulating material is aligned with a surface 350a of the insulating interlayer 350 on the same plane. The surface of the insulating material and the surface 350a of the insulating interlayer 350 are aligned with each other on the same plane to form an insulating slit 360 in the groove 290.

The memory cell array 10-2 shown in FIG. 10 can be manufactured by proceeding with the over-described processes. The semiconductor memory device of the second embodiment is formed by performing known pre-processing before the over-described processes and performing known post-processing after the over-described processes. However, the method of manufacturing the semiconductor memory device of the second embodiment is not limited to the over-described method.

Operational effects of the semiconductor memory device of the second embodiment described over will be described. Similarly to the semiconductor memory device 1 of the first embodiment, the semiconductor memory device of the second embodiment includes the first semiconductor portion 48 including a first semiconductor of single-crystal with a defect level of hardly any defects in a region 44 including a center 40c equidistant from a first end 40e and a second end 40f when seen in the Z-direction. A first channel portion 42 is formed of a first semiconductor of single-crystal with a defect level of hardly any defects, so that variations in a threshold voltage of a plurality of memory cell transistors MT are suppressed. Therefore, according to the semiconductor memory device of the second embodiment, electrical characteristics can be improved.

The semiconductor memory device of the second embodiment includes the insulating portion 70 in a region 64 including a center 60c equidistant from a third end 60e and a fourth end 60f when seen in the Z-direction. The semiconductor memory device of the second embodiment includes the second semiconductor portion 68 including a second semiconductor of poly-crystal between the insulating portion 70 and two second conductive layers 26 functioning as a selected gate line SGD in the X-direction. Since a second channel portion 62 adjacent to the selected gate line SGD in the X-direction has a thin film channel having a hollow structure, a deterioration in cut-off characteristics is suppressed and the occurrence of a defective operation of the selected gate line SGD is prevented. Therefore, according to the semiconductor memory device of the second embodiment, electrical characteristics can be improved.

Third Embodiment

Next, a configuration of a semiconductor memory device according a third embodiment will be described. Although not shown in the drawing, the semiconductor memory device of the third embodiment is a NAND flash memory, similar to the semiconductor memory device 1 of the first embodiment and the semiconductor memory device of the second embodiment. Hereinafter, with regard to components of the semiconductor memory device of the third embodiment, only contents different from those of the components of the semiconductor memory device of the second embodiment will be described, and detailed description of contents common to the contents of the components of the semiconductor memory device of the second embodiment will be omitted.

Figure 20:
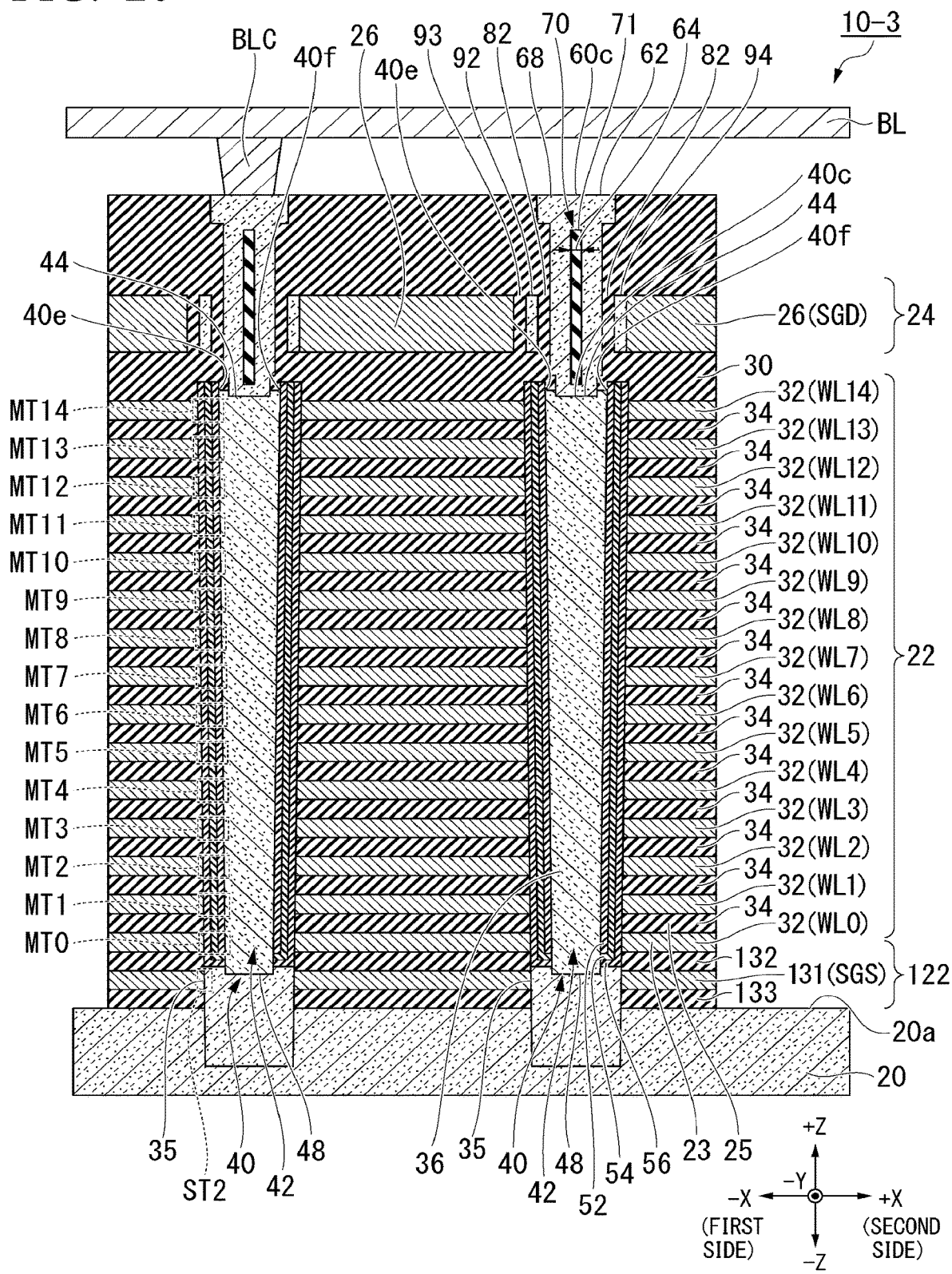
FIG. 20 is a partial cross-sectional view of a memory cell array of a semiconductor memory device of a third embodiment.

FIG. 20 is a cross-sectional view of a portion of a memory cell array 10-3 of the semiconductor memory device of the third embodiment. As shown in FIG. 20, a second stack 24 includes, for example, one second conductive layer 26. The minimum thickness of the second conductive layer 26 in the Z-direction is larger than the maximum thickness of one first conductive layer 23 in the Z-direction and is larger than the maximum thickness of a conductive layer 32 in the Z-direction. Specifically, the minimum thickness of one second conductive layer 26 in the Z-direction is larger than twice the maximum thickness of one first conductive layer 23 in the Z-direction.

A semiconductor film 92 is provided between a fifth insulating film 82 and a second conductive layer 26 adjacent to each other from a first side of a second semiconductor portion 68 in the X-direction. An insulating film 93 is provided between the semiconductor film 92 and the second conductive layer 26 in the X-direction. A semiconductor film 94 is provided between the fifth insulating film 82 and the second conductive layer 26 adjacent to each other from a second side of the second semiconductor portion 68 in the X-direction. Each of the semiconductor films 92 and 94 is formed of, for example, amorphous silicon (aSi).

Next, a method of manufacturing the memory cell array 10-3 of the semiconductor memory device of the third embodiment will be briefly described. The method of manufacturing the memory cell array 10-3 of the semiconductor memory device of the third embodiment includes a first intermediate stack forming process, a first hole forming process, a first semiconductor material supply process, a second intermediate stack forming process, a second hole forming process, a second semiconductor material supply process, and an insulating material supply process. That is, when the memory cell array 10-3 of the semiconductor memory device of the third embodiment is manufactured, a first hole H1 and a second hole H2 are formed in different processes, similar to when the memory cell array 10-2 of the second embodiment is manufactured.

Figure 21:
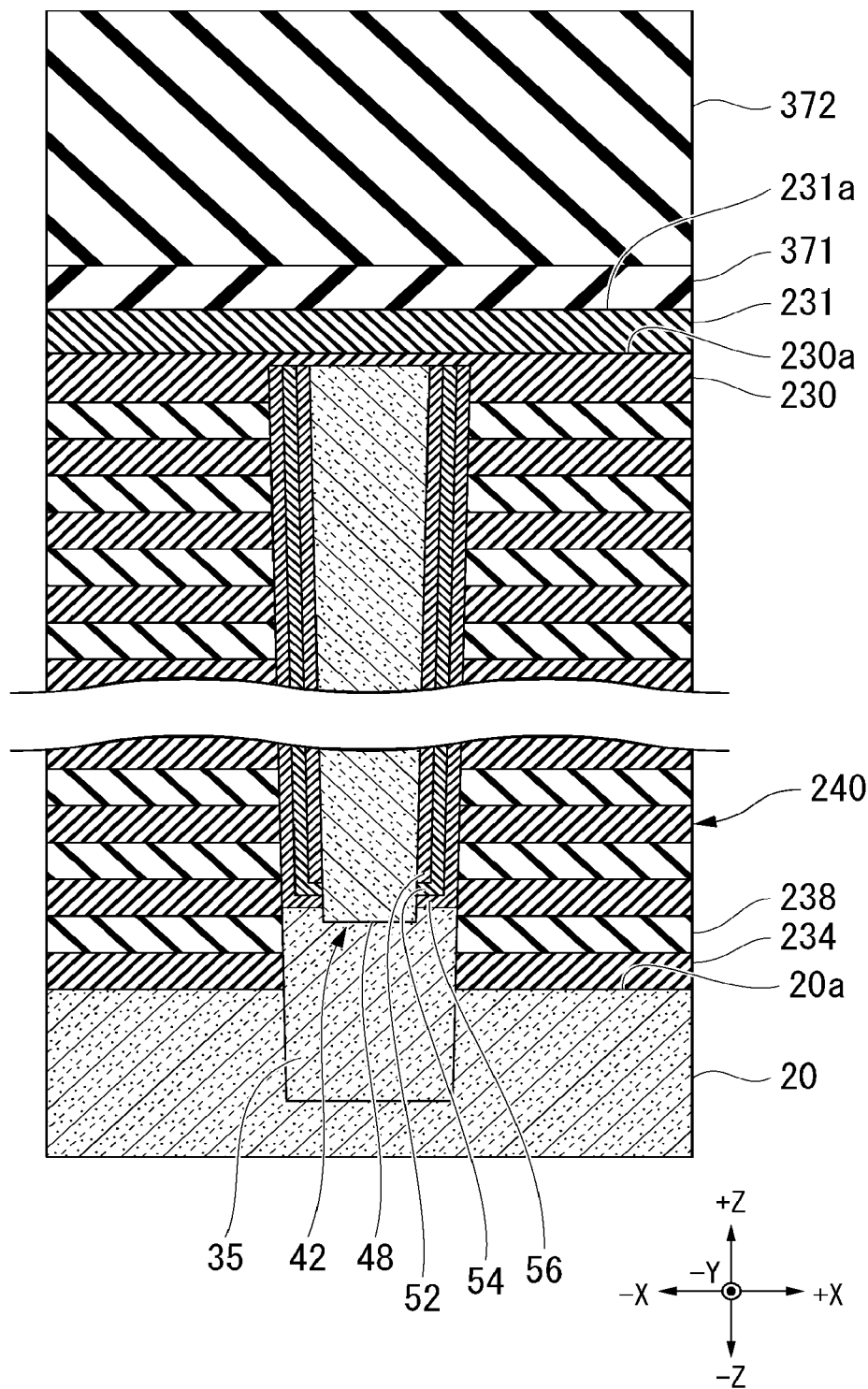
FIG. 21 is a cross-sectional view showing a step involved in a manufacturing process for the memory cell array shown in FIG. 20.

First, processes up to a first plural material recessing process described with reference to FIG. 11 are performed similar to when the memory cell array 10-2 of the second embodiment is manufactured. FIG. 21 is a cross-sectional view showing an example of a manufacturing process for the memory cell array 10-3. As shown in FIG. 21, an insulating film 231 including aluminum oxide (AlO) or the like is formed in a surface 230a of an insulating layer 230. For example, an insulating film 371 including oxide and an insulating layer 372 including silicon nitride or the like are formed in a surface 231a of the insulating film 231 through atomic layer deposition (ALD) or the like. The minimum thickness of the insulating layer 372 in the Z-direction is set to be larger than the minimum thickness of the insulating film 371 in the Z-direction.

Figure 22:
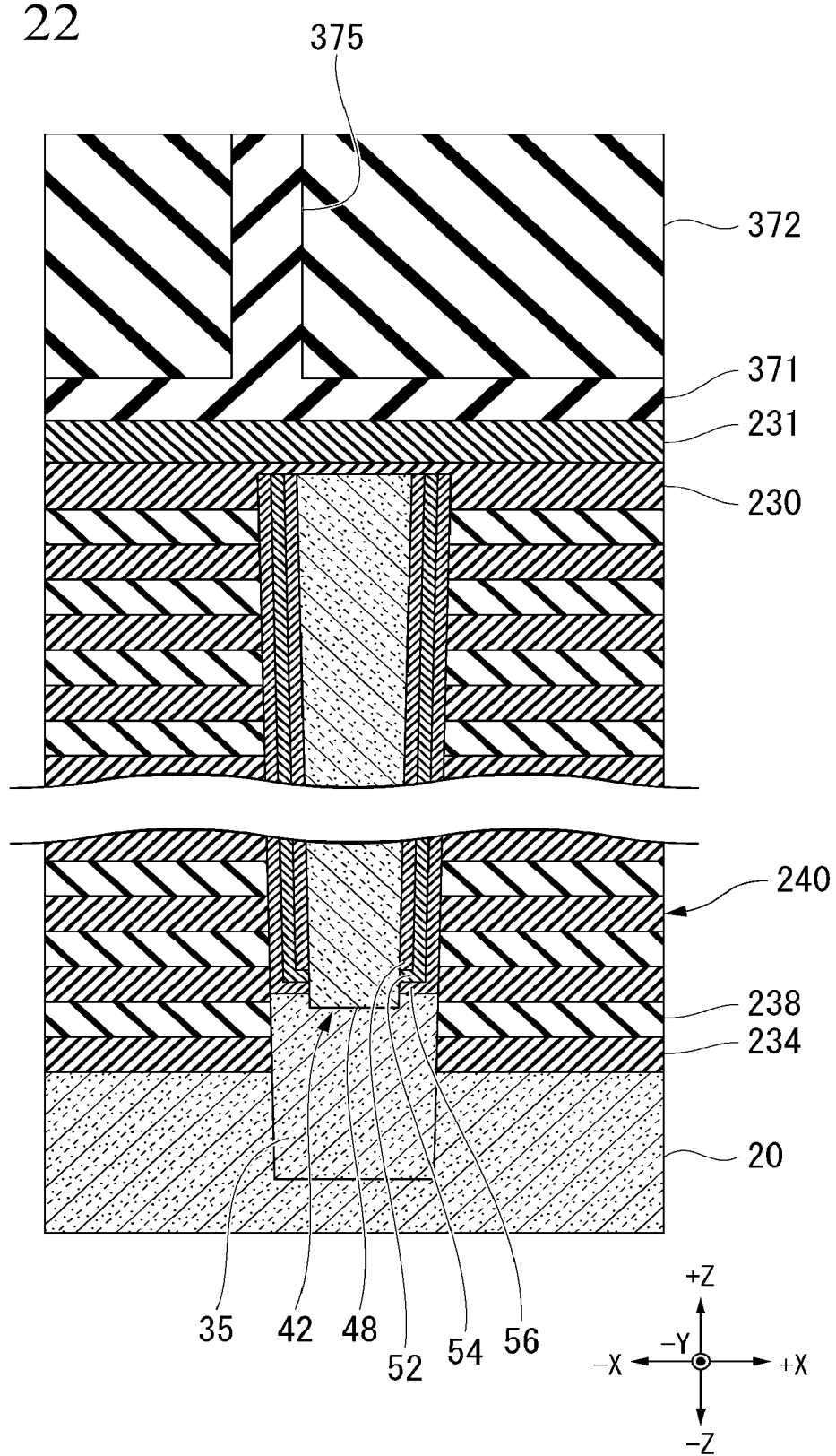
FIG. 22 is a cross-sectional view showing a step involved in the manufacturing process for the memory cell array shown in FIG. 20.

FIG. 22 is a cross-sectional view showing an example of a manufacturing process for the memory cell array 10-3. As shown in FIG. 22, an insulating film 375 extending inside the insulating layer 372 in the Z-direction is formed. The insulating film 375 is connected to the insulating film 371. The insulating film 371 is formed closer to a first side than a first semiconductor portion 48 in the X-direction.

Figure 23:
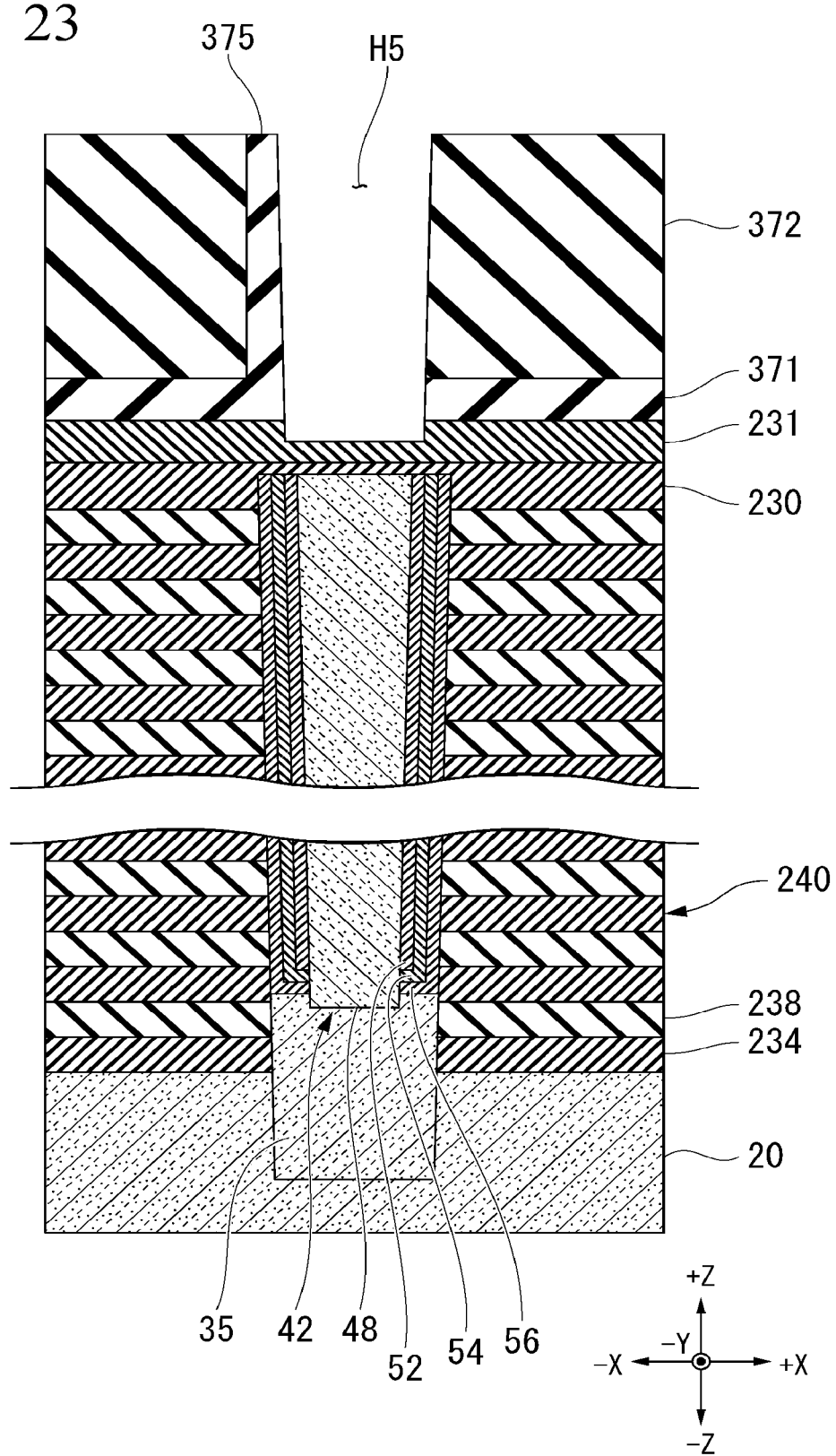
FIG. 23 is a cross-sectional view showing a step involved in the manufacturing process for the memory cell array shown in FIG. 20.

FIG. 23 is a cross-sectional view showing an example of a manufacturing process for the memory cell array 10-3. As shown in FIG. 23, a hole H5 extending inside the insulating layer 372 and the insulating film 371 in the Z-direction is formed. The hole H5 substantially overlaps the second semiconductor portion 68 in the X-direction. When the hole H5 is formed, a portion on a second side of the insulating film 375 in the X-direction is removed, and a concave portion is formed in the insulating film 231.

Figure 24:
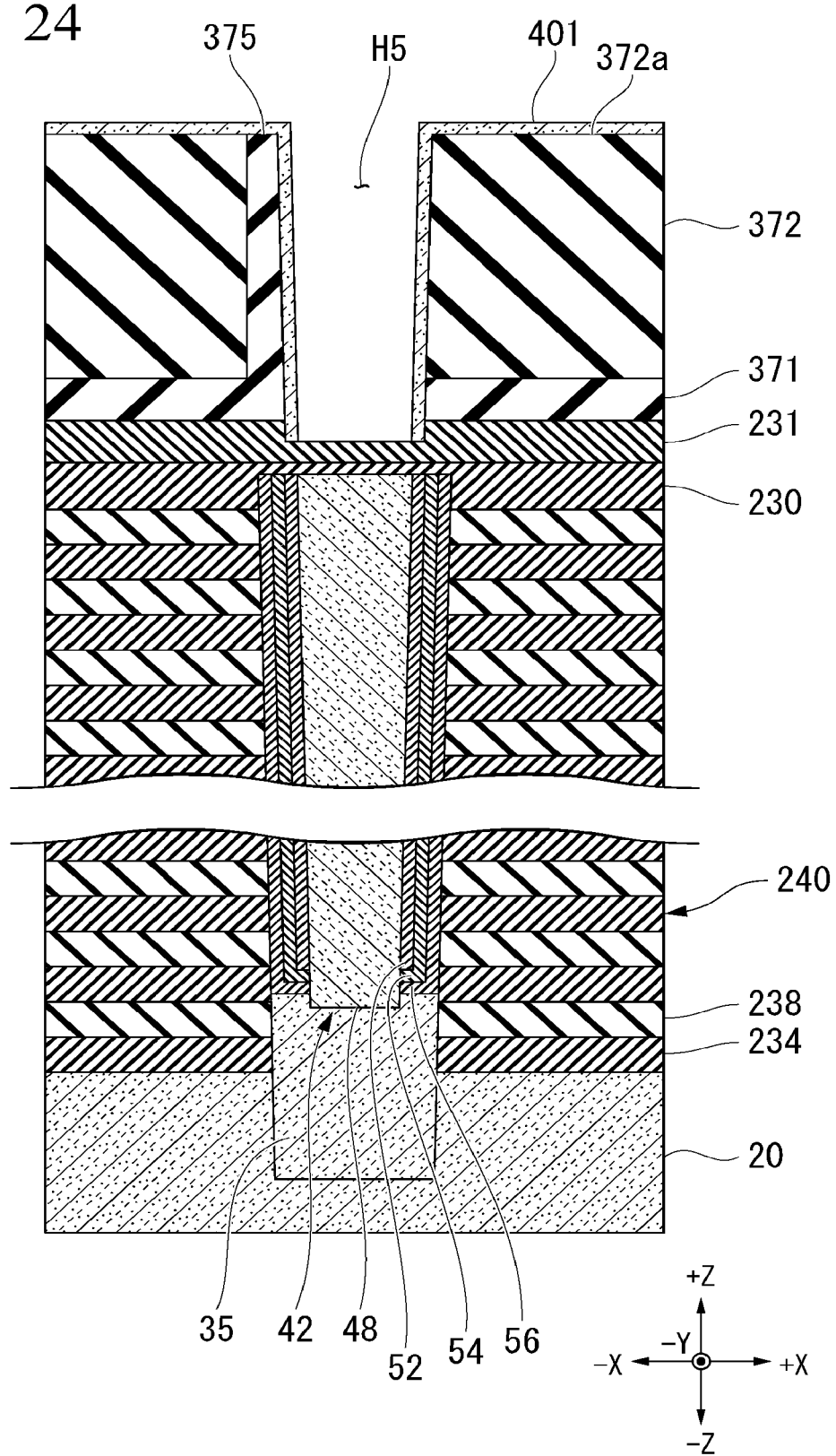
FIG. 24 is a cross-sectional view showing a step involved in the manufacturing process for the memory cell array shown in FIG. 20.
Figure 25:
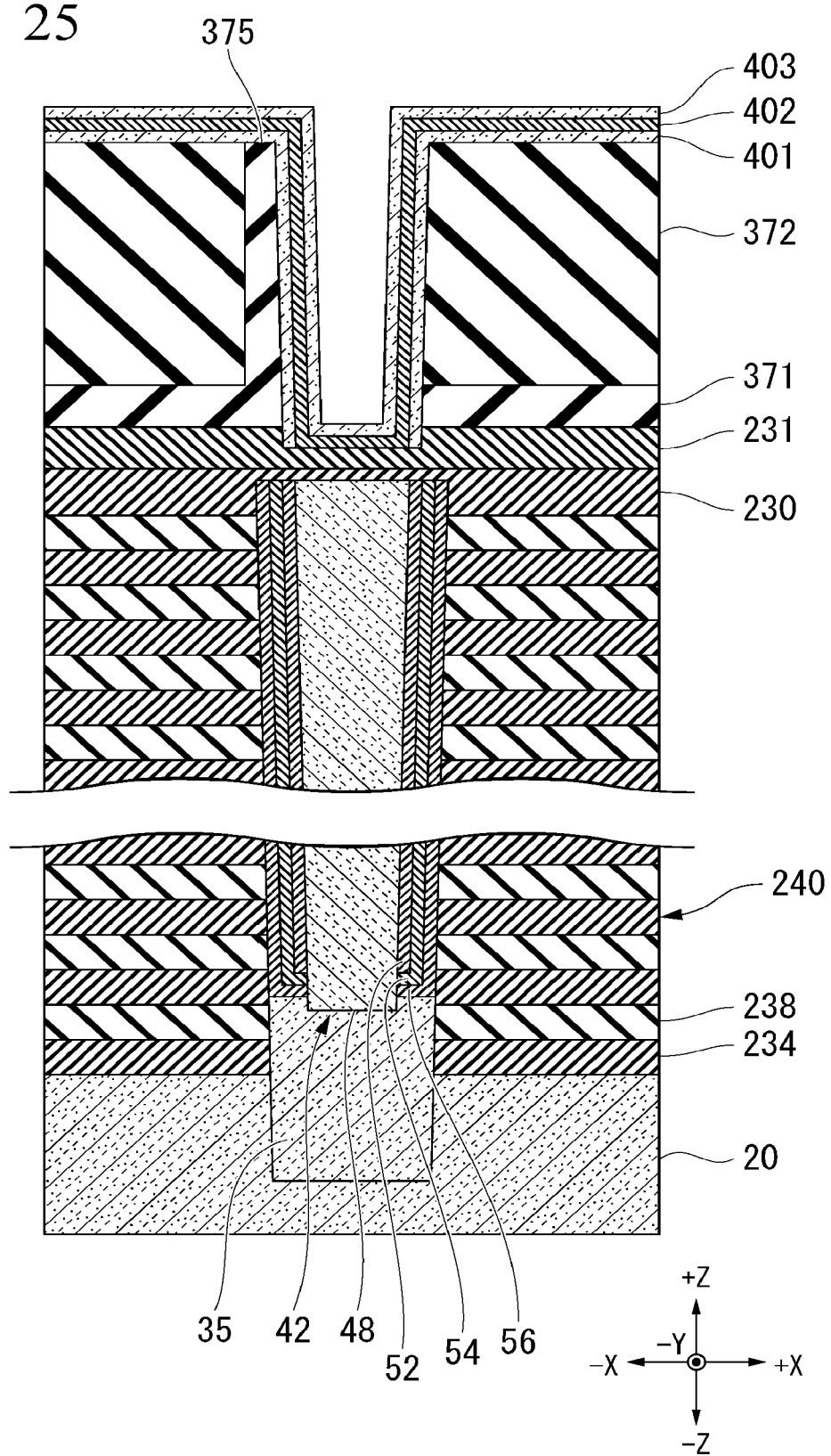
FIG. 25 is a cross-sectional view showing a step involved in the manufacturing process for the memory cell array shown in FIG. 20.

FIG. 24 is a cross-sectional view showing an example of a manufacturing process for the memory cell array 10-3. As shown in FIG. 24, a semiconductor film 401 is integrally formed on a surface 372a of the insulating layer 372, and each of a side surface of the insulating layer 372, a side surface of the insulating film 371, and a side surface of the insulating film 231 which are exposed to the hole H5. The semiconductor film 401 includes the same material as that of each of the semiconductor films 92 and 94. FIG. 25 is a cross-sectional view showing an example of a manufacturing process for the memory cell array 10-3. As shown in FIG. 25, an insulating film 402 and a dummy film 403 including amorphous silicon or the like are formed on the surface of the semiconductor film 401, a side surface exposed to the hole H5, and the bottom face of the concave portion of the insulating film 231.

Figure 26:
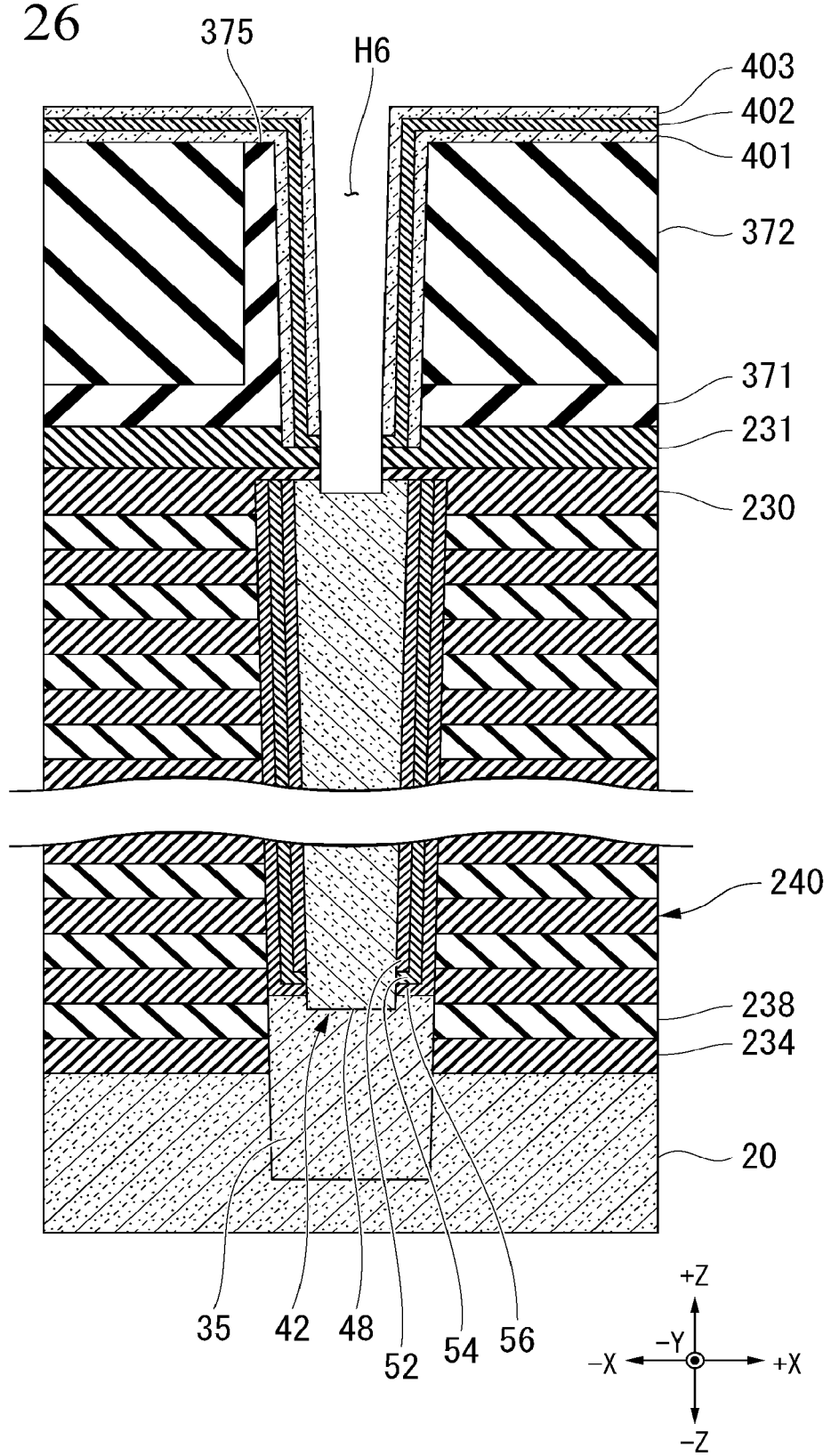
FIG. 26 is a cross-sectional view showing a step involved in the manufacturing process for the memory cell array shown in FIG. 20.
Figure 27:
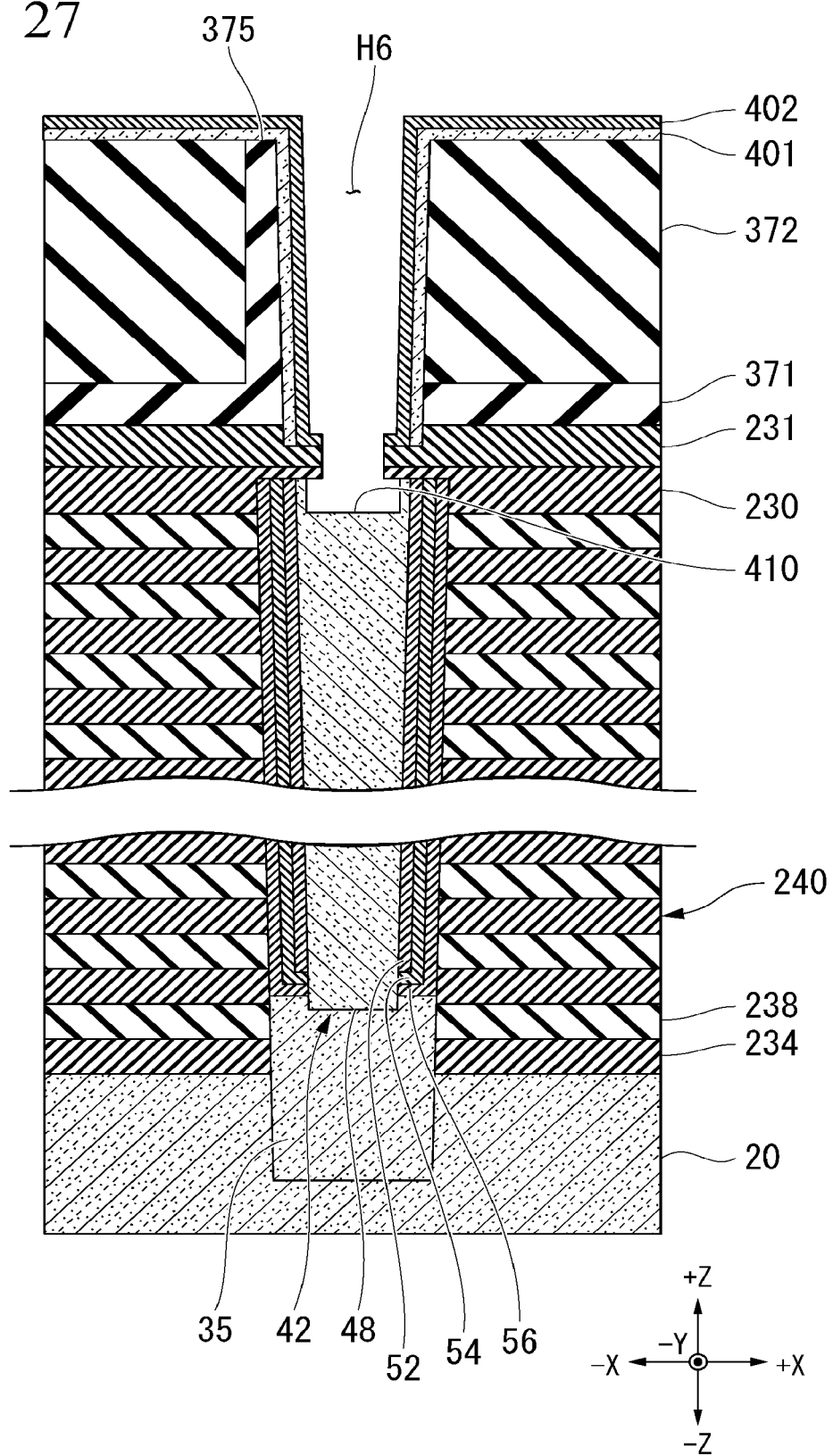
FIG. 27 is a cross-sectional view showing a step involved in the manufacturing process for the memory cell array shown in FIG. 20.

Each of FIGS. 26 and 27 is a cross-sectional view showing an example of a manufacturing process for the memory cell array 10-3. As shown in FIG. 26, a hole H6 extending through the insulating film 231 in the Z-direction is formed while removing the semiconductor film 401, the insulating film 402, and the dummy film 403 which are positioned at the bottom of the hole H5. At the bottom of the hole H6, a concave portion is formed in an end portion of the first semiconductor portion 48 in the +Z-direction. Subsequently, the dummy film 403 remaining is removed. As shown in FIG. 27, the concave portion of the first semiconductor portion 48 is expanded in each of the −Z-direction and the X-direction through, for example, selective etching to form a concave portion 410 connected to the hole H6 in the Z-direction.

Figure 28:
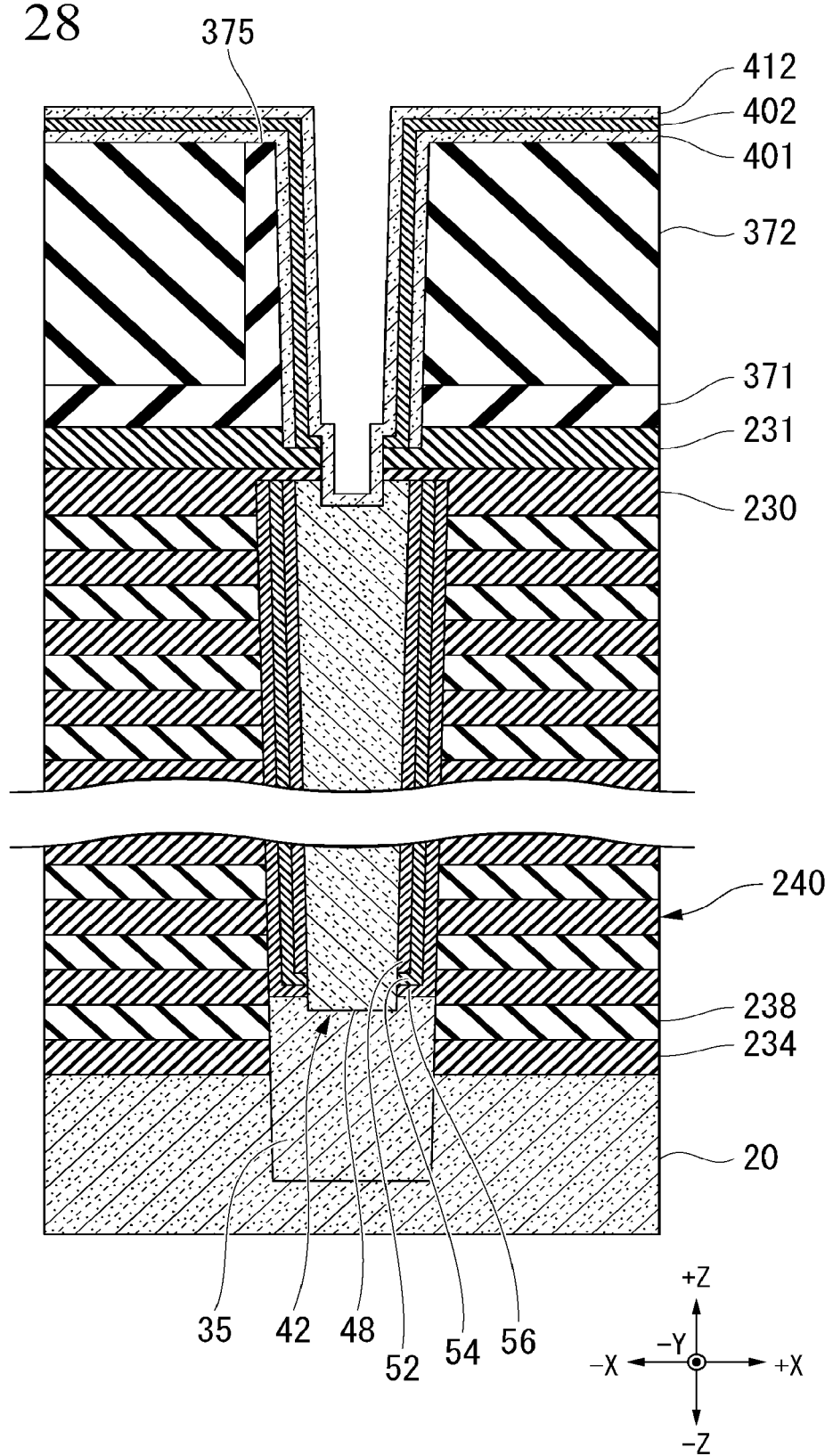
FIG. 28 is a cross-sectional view showing a step involved in the manufacturing process for the memory cell array shown in FIG. 20.
Figure 29:
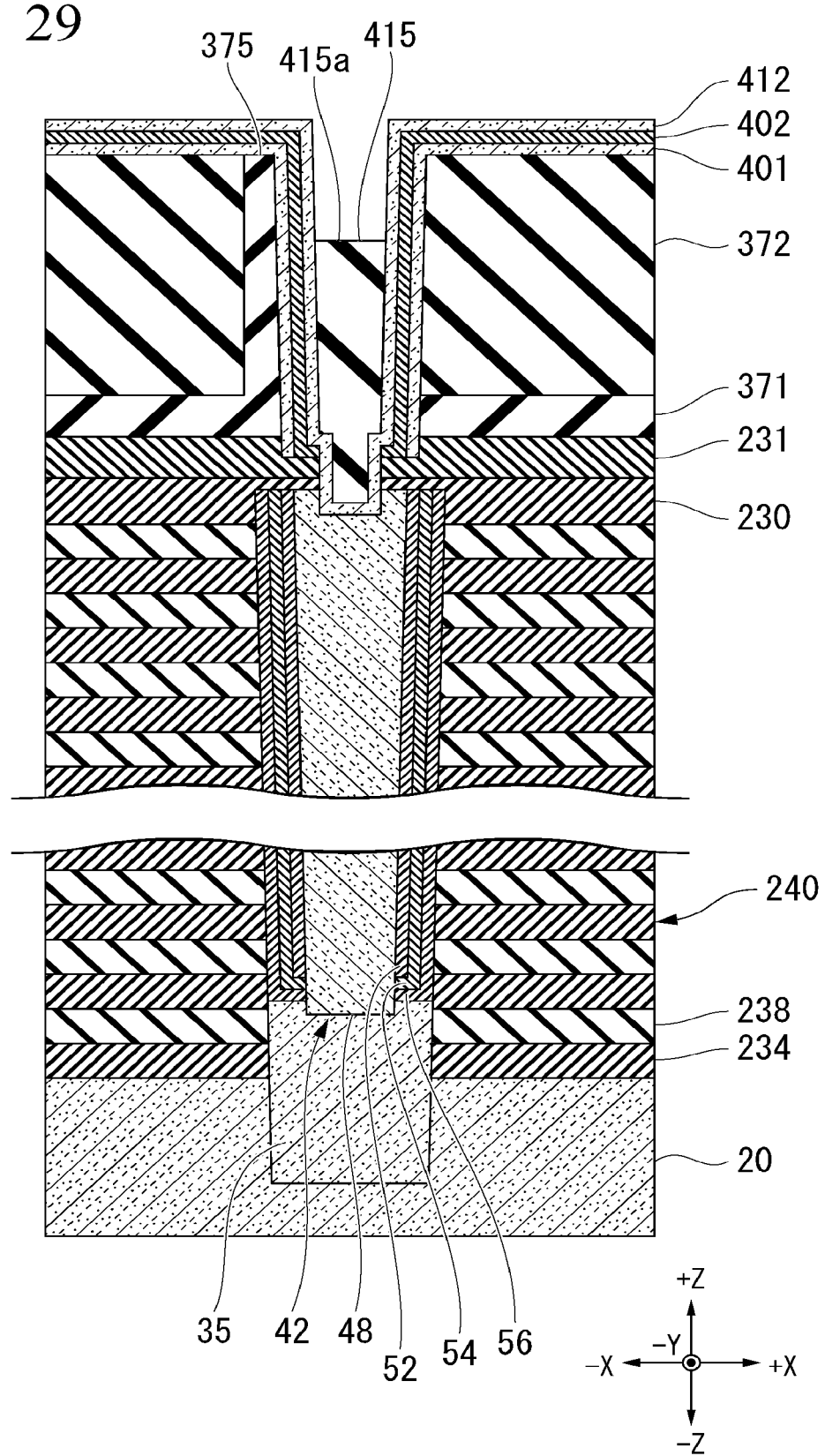
FIG. 29 is a cross-sectional view showing a step involved in the manufacturing process for the memory cell array shown in FIG. 20.

Each of FIGS. 28 and 29 is a cross-sectional view showing an example of a manufacturing process for the memory cell array 10-3. As shown in FIG. 28, a dummy film 412 including amorphous silicon or the like is formed on the side surface and the surface of each constituent element exposed to the hole H6 and the concave portion 410. Subsequently, as shown in FIG. 29, an insulating film 415 such as silicon oxide is formed in a space surrounded by the dummy film 412. A surface 415a of the insulating film 415 is positioned between the surface 372a of the insulating layer 372 and the surface 371a of the insulating film 371 in the Z-direction.

Figure 30:
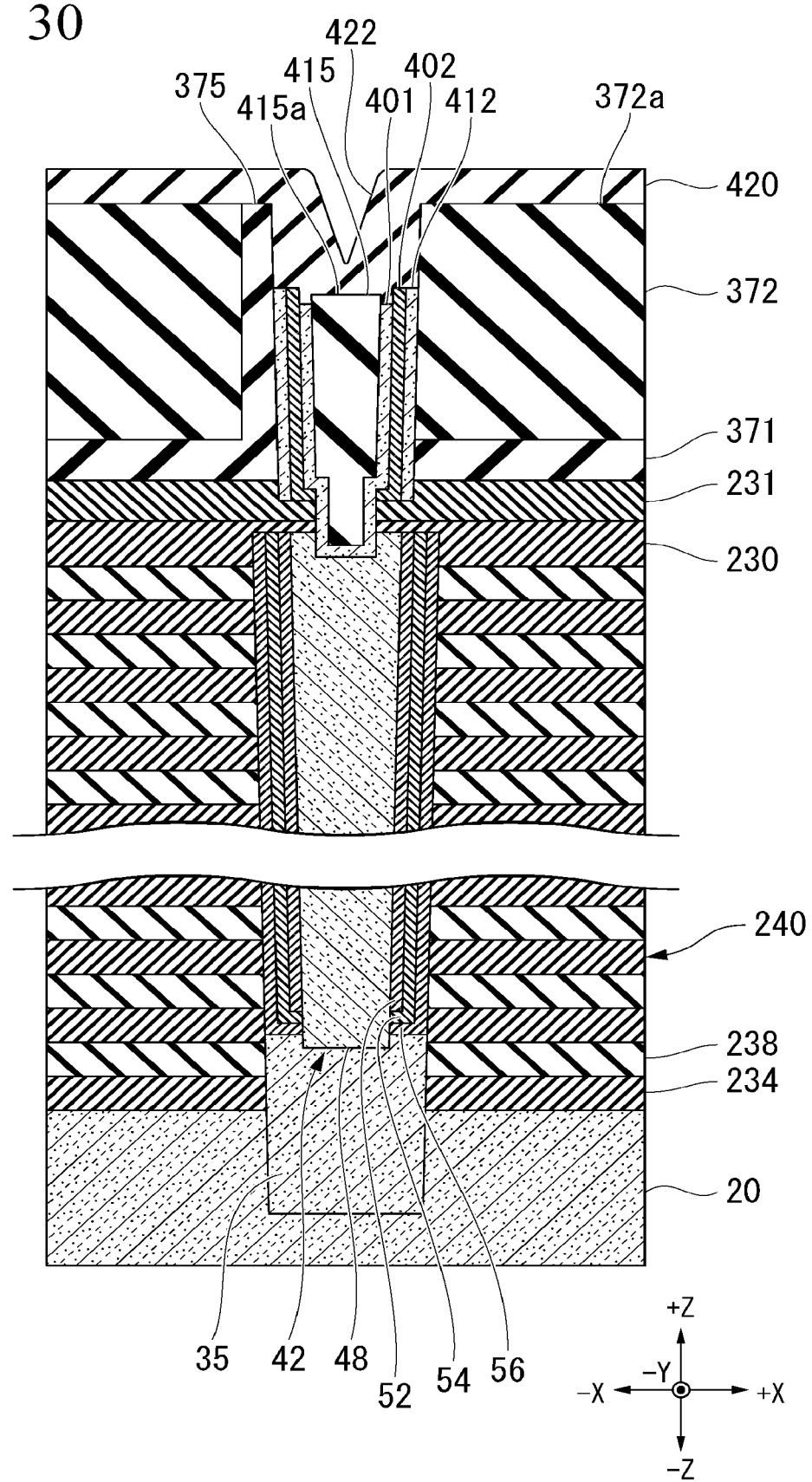
FIG. 30 is a cross-sectional view showing a step involved in the manufacturing process for the memory cell array shown in FIG. 20.

FIG. 30 is a cross-sectional view showing an example of a manufacturing process for the memory cell array 10-3. As shown in FIG. 30, the semiconductor film 401, the insulating film 402, and the dummy film 412 are recessed in the −Z-direction, and ends in the +Z-direction of the semiconductor film 401, the insulating film 402, and the dummy film 412 in the Z-direction are aligned at the same position as the surface 415a of the insulating film 415. Subsequently, an oxide film 420 including silicon oxide or the like is formed so as to cover each of the surface 372a of the insulating layer 372, the semiconductor film 401, the insulating film 402, the dummy film 412, and the insulating film 415. A concave portion 422 is formed in the oxide film 420 in a portion overlapping the first semiconductor portion 48 and the insulating film 415 in the Z-direction. The width of the concave portion 422 in the X-direction decreases toward the −Z-direction.

Figure 31:
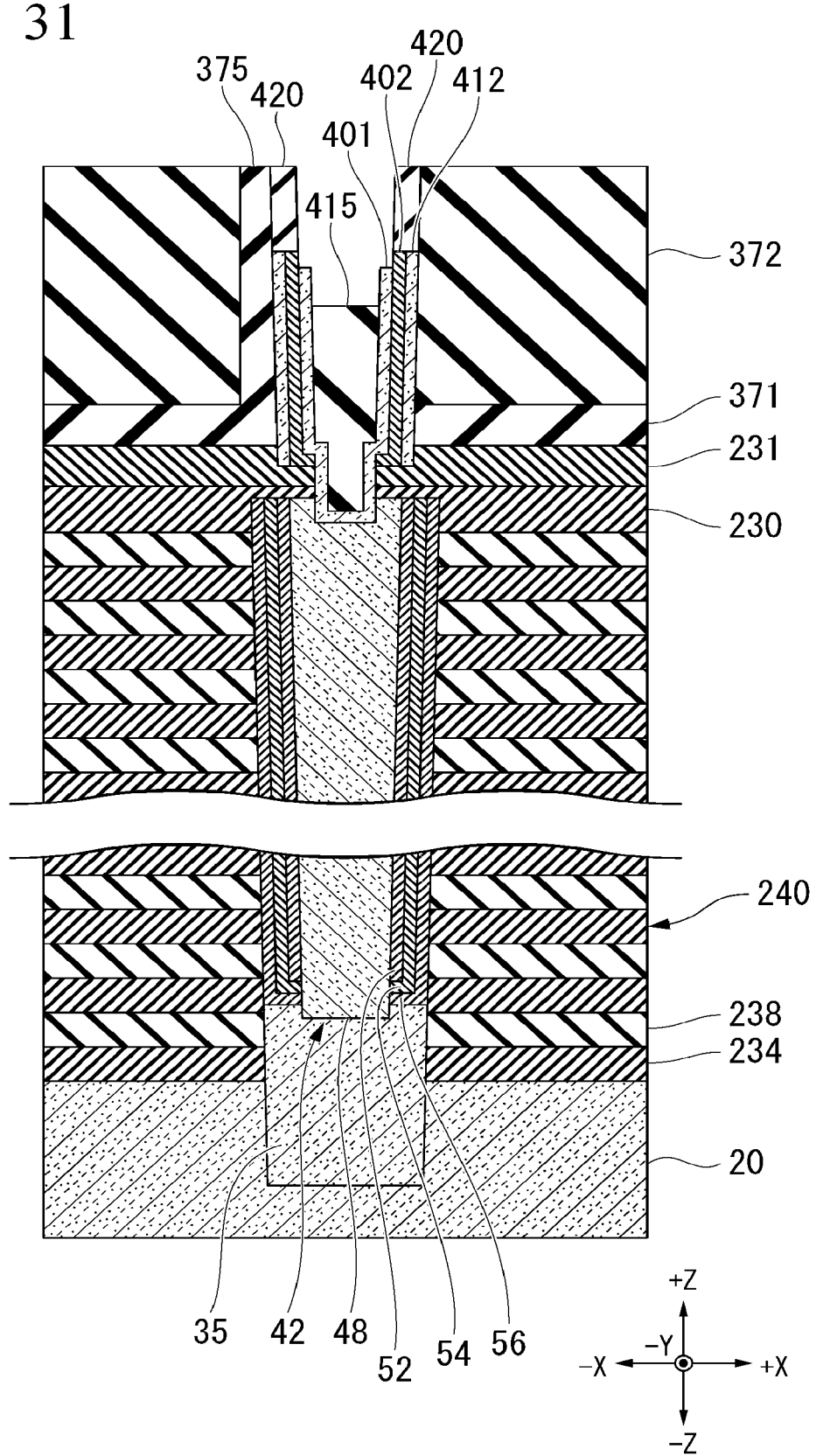
FIG. 31 is a cross-sectional view showing a step involved in the manufacturing process for the memory cell array shown in FIG. 20.
Figure 32:
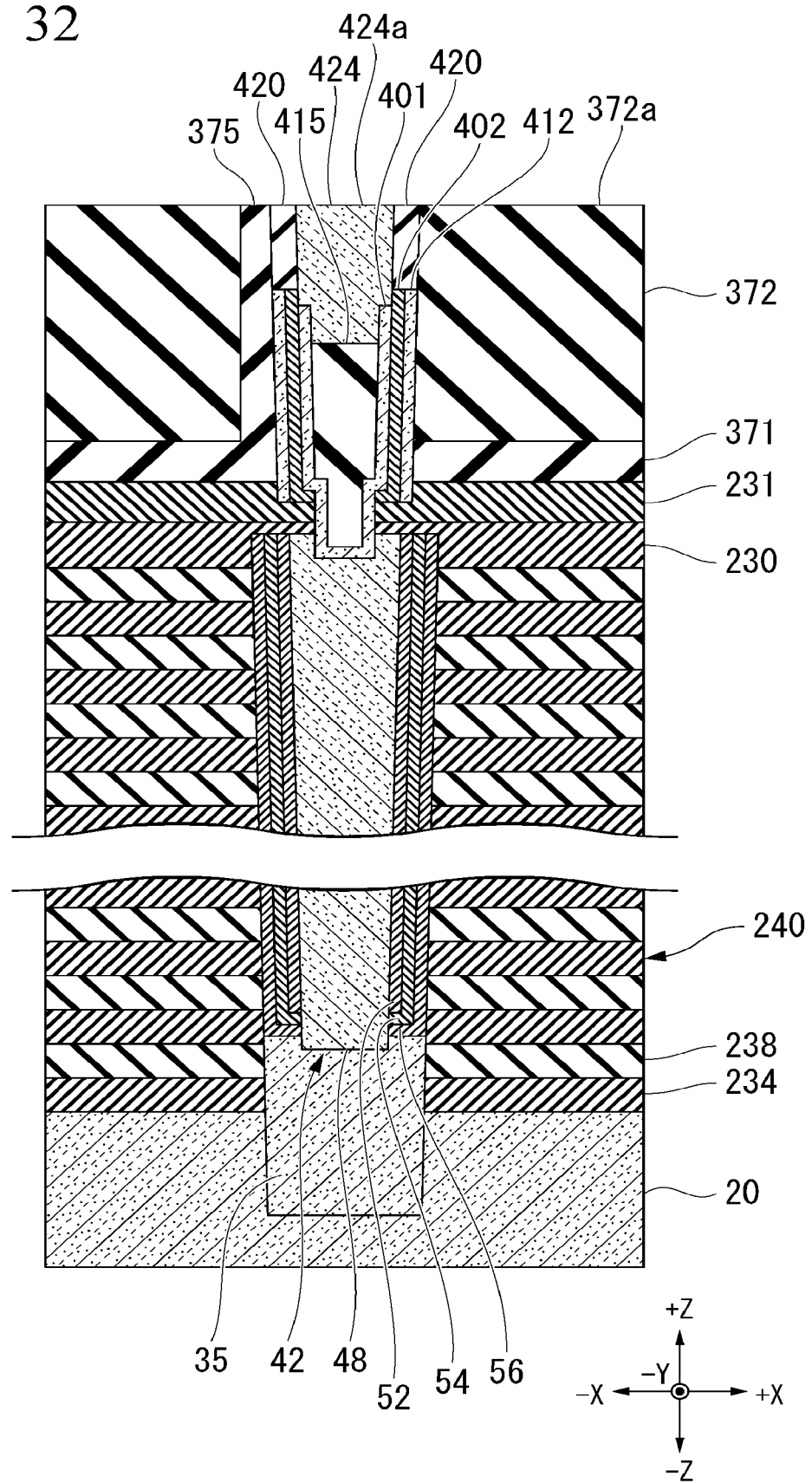
FIG. 32 is a cross-sectional view showing a step involved in the manufacturing process for the memory cell array shown in FIG. 20.
Figure 33:
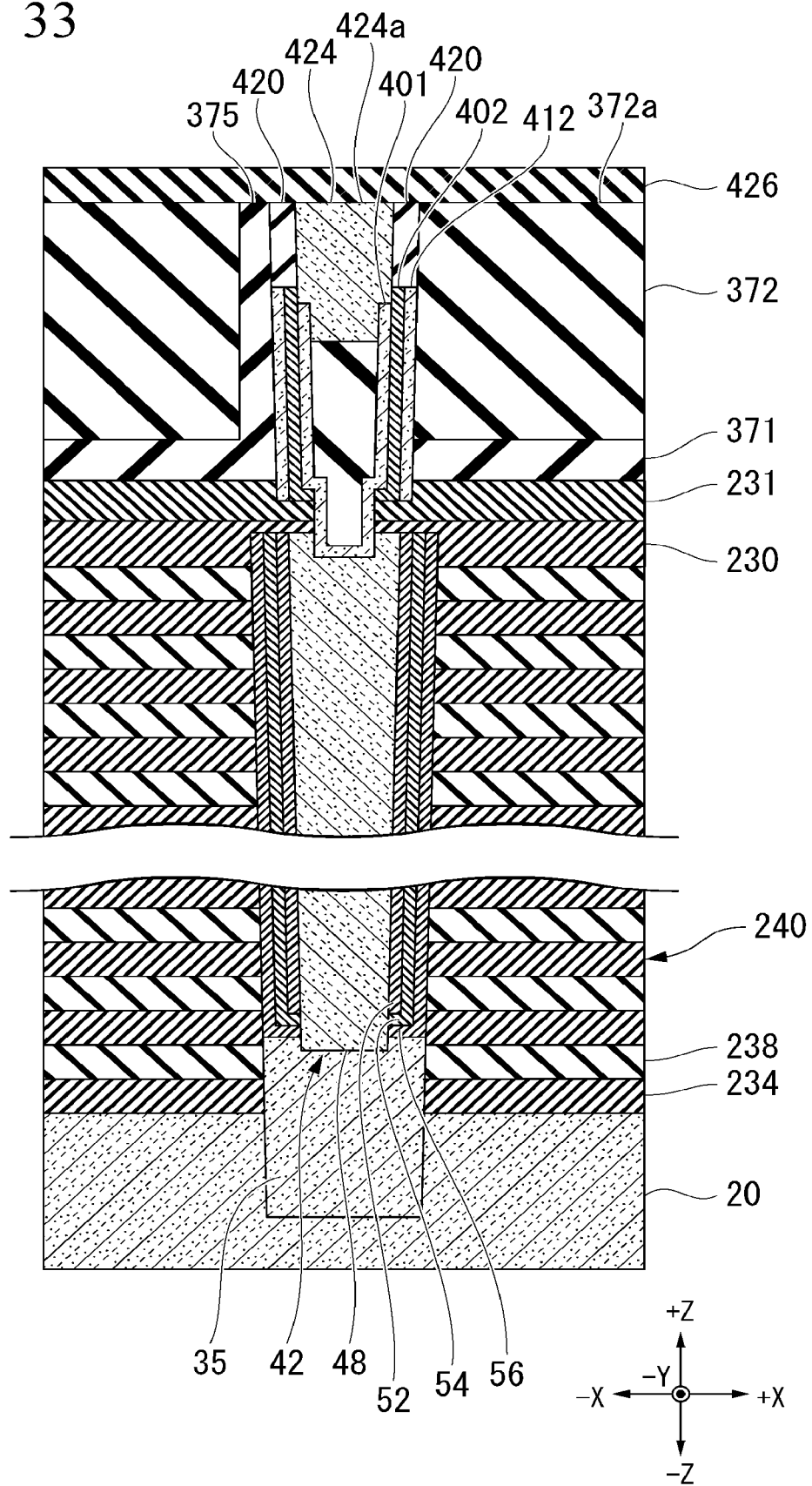
FIG. 33 is a cross-sectional view showing a step involved in the manufacturing process for the memory cell array shown in FIG. 20.

Each of FIGS. 31, 32, and 33 is a cross-sectional view showing an example of a manufacturing process for the memory cell array 10-3. For example, only the oxide film 420 in substantially the +Z-direction rather than the insulating film 402 and the dummy film 412 is left through etching or the like as shown in FIG. 31, and the oxide film 420 in the other portions is removed. As shown in FIG. 32, a semiconductor layer 424 including, for example, amorphous silicon is formed so as to cover each of the semiconductor film 401, the insulating film 402, the dummy film 412, and the insulating film 415. A surface 424a of the semiconductor layer 424 and a surface 372a of the insulating layer 372 are set to be on substantially the same plane. As shown in FIG. 33, an insulating film 426 including, for example, silicon oxide is formed on the surface 424a of the semiconductor layer 424 and the surface 372a of the insulating layer 372. Subsequently, although not shown in the drawing, an upper electrode and the like are processed. Through the processing, the insulating film 426 is removed, so that components in a state similar to that shown in FIG. 32 are obtained.

Figure 34:
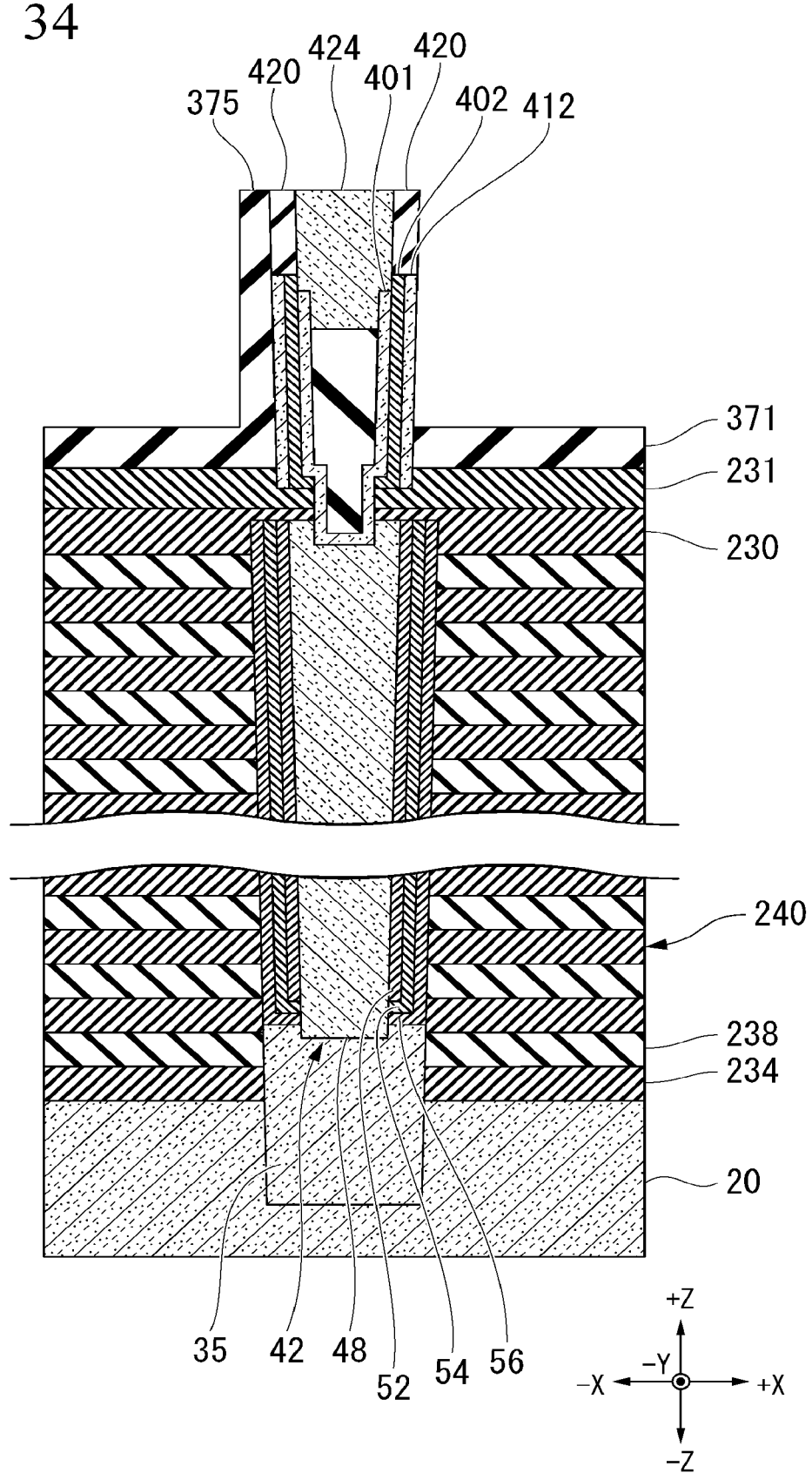
FIG. 34 is a cross-sectional view showing a step involved in the manufacturing process for the memory cell array shown in FIG. 20.
Figure 35:
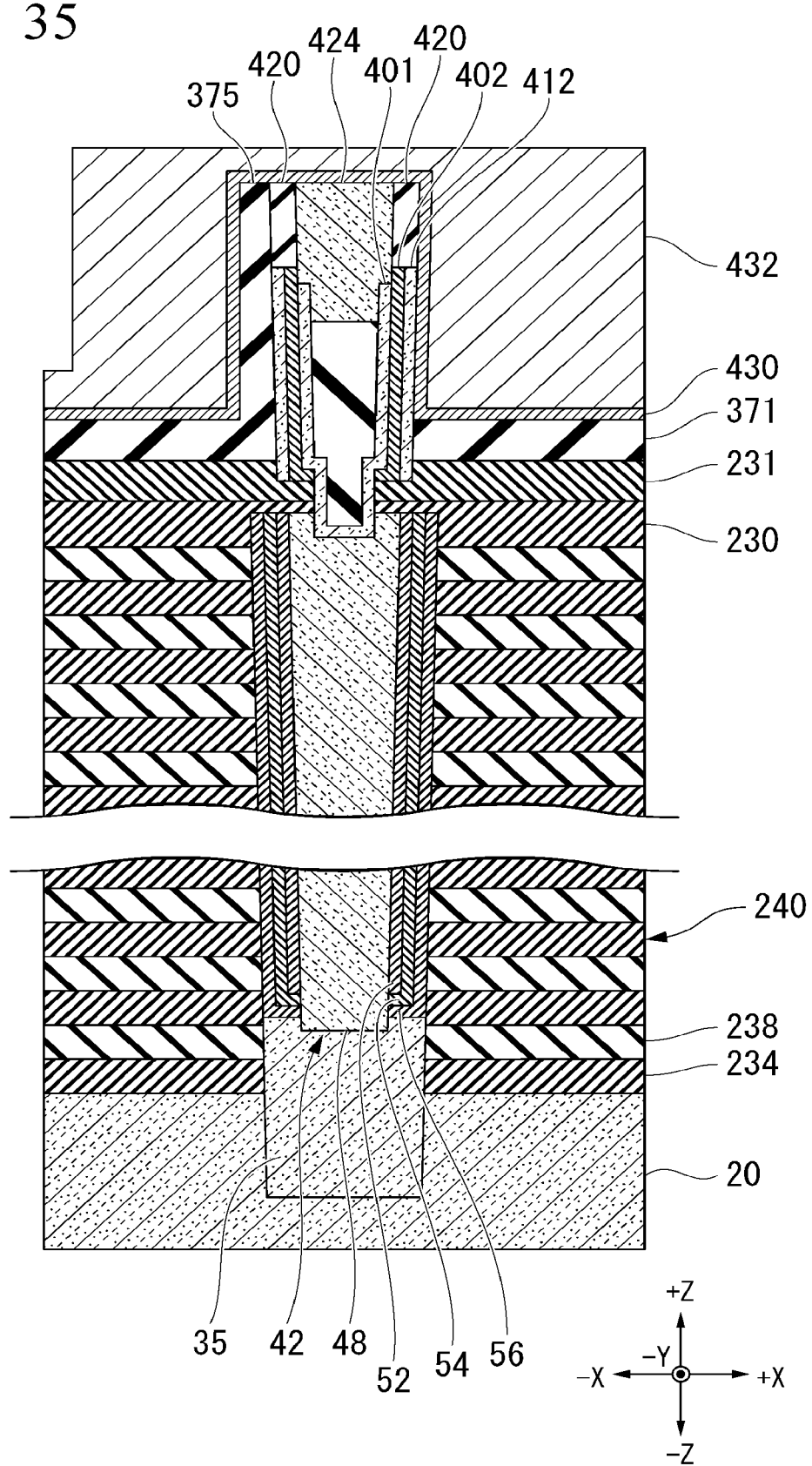
FIG. 35 is a cross-sectional view showing a step involved in the manufacturing process for the memory cell array shown in FIG. 20.

Each of FIGS. 34 and 35 is a cross-sectional view showing an example of a manufacturing process for the memory cell array 10-3. For example, the insulating layer 372 is removed as shown in FIG. 34 using a medicinal solution, etching, or the like. Subsequently, as shown in FIG. 35, a barrier film 430 that covers the insulating film 371, the insulating film 375, the oxide film 420, and the semiconductor layer 424 is formed. A metal layer 432 that covers the barrier film 430 is formed. The metal layer 432 includes, for example, tungsten.

Figure 36:
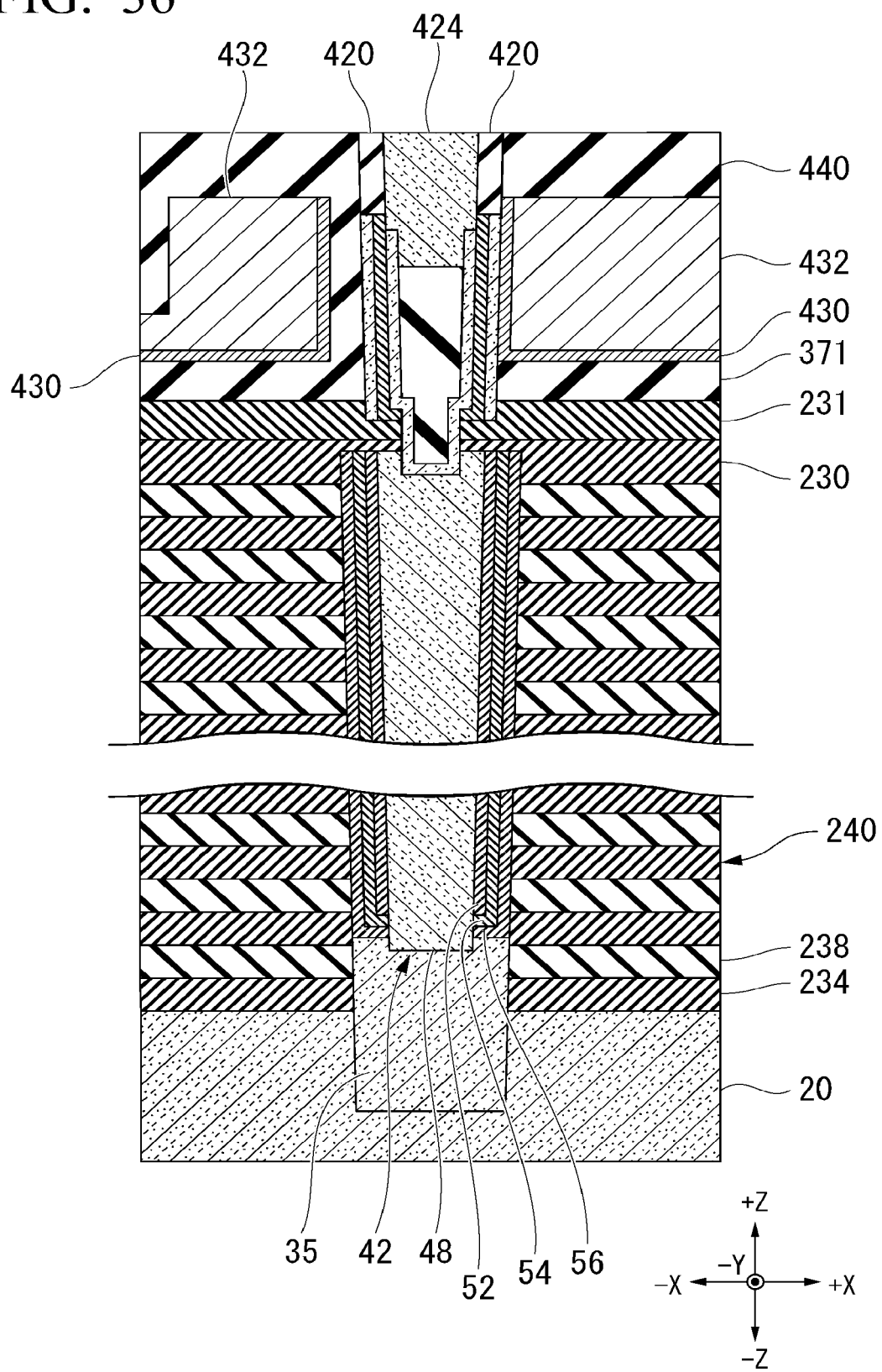
FIG. 36 is a cross-sectional view showing a step involved in the manufacturing process for the memory cell array shown in FIG. 20.

FIG. 36 is a cross-sectional view showing an example of a manufacturing process for the memory cell array 10-3. As shown in FIG. 36, the metal layer 432 and the barrier film 430 are recessed in the −Z-direction, and an insulating interlayer 440 that covers the recessed metal layer 432 and barrier film 430 is formed. The insulating interlayer 440 is formed of, for example, silicon oxide or the like.

The plurality of first dummy layers 238 of the first intermediate stack 240 are removed using, for example, a medicinal solution or the like at a predetermined timing for the over-described processes. A conductive material including the same material as that of the first conductive layer 23 is supplied to a region 331 from which each of the first dummy layers 238 is removed.

The memory cell array 10-3 shown in FIG. 20 can be manufactured by proceeding with the over-described processes. The semiconductor memory device of the third embodiment is formed by performing known pre-processing before the over-described processes and performing known post-processing after the over-described processes. However, the method of manufacturing the semiconductor memory device of the third embodiment is not limited to the over-described method.

Operational effects of the semiconductor memory device of the third embodiment described over will be described. Similar to the semiconductor memory device of the second embodiment, the semiconductor memory device of the third embodiment includes the first semiconductor portion 48 including a first semiconductor of single-crystal with a defect level of hardly any defects in a region 44 including a center 40c equidistant from a first end 40e and a second end 40f when seen in the Z-direction. A first channel portion 42 is formed of a first semiconductor of single-crystal with a defect level of hardly any defects, so that variations in a threshold voltage of a plurality of memory cell transistors MT are suppressed. Therefore, according to the semiconductor memory device of the third embodiment, electrical characteristics can be improved.

The semiconductor memory device of the third embodiment includes the insulating portion 70 in a region 64 including a center 60c equidistant from a third end 60e and a fourth end 60f when seen in the Z-direction. The semiconductor memory device of the third embodiment includes the second semiconductor portion 68 including a second semiconductor of poly-crystal between the insulating portion 70 and two second conductive layers 26 functioning as a selected gate line SGD in the X-direction. Since a second channel portion 62 adjacent to the selected gate line SGD in the X-direction has a thin film channel having a hollow structure, a deterioration in cut-off characteristics is suppressed and the occurrence of a defective operation of the selected gate line SGD is prevented. Therefore, according to the semiconductor memory device of the third embodiment, electrical characteristics can be improved.

Although embodiments of the present invention have been described over, those embodiments are described as examples, and do not limit the scope of the invention. Those embodiments may be embodied in other various modes, and may be variously omitted, substituted, and modified without departing from the scope of the invention. Those embodiments and modification thereof are within the scope and the gist of the invention, and are within the scope of the invention described in the scope of claims and the equivalent thereof.

For example, the insulating portions 70 of the semiconductor memory device of the second and third embodiments may be constituted by an insulating material other than air, or may be formed of an insulator such as silicon oxide.

For example, the first insulating layers 25 of the semiconductor memory devices of the over-described embodiments may be constituted by, for example, an air gap.

For example, in a semiconductor memory device of an embodiment different from the over-described embodiments, each of the two second columnar bodies 60 may further include a fifth insulating film of a single layer which is provided between the second channel portion 62 and three second conductive layers 26 in the X-direction. That is, each of the two second columnar bodies 60 may include the fifth insulating film instead of the third insulating film 72, the second charge storage film 74, and the fourth insulating film 76. The fifth insulating film is formed of, for example, silicon oxide.

What is claimed is:

1. A semiconductor memory device comprising:
a substrate;
a plurality of first conductive layers which are stacked over the substrate in a first direction;
a second conductive layer which is disposed over the plurality of first conductive layers;
a first pillar which extends inside the plurality of first conductive layers in the first direction, the first pillar including a first semiconductor portion including a first semiconductor of single-crystal; and
a second pillar which extends inside the second conductive layer in the first direction, the second pillar including an insulating portion and a second semiconductor portion, the insulating portion serving as an axis and including an insulator, the second semiconductor portion being disposed on an outer circumference of the insulating portion in view of the first direction, the second semiconductor portion being in contact with the first semiconductor portion, and the second semiconductor portion including a second semiconductor of poly-crystal,
wherein the first pillar includes a first portion and a second portion, the first portion is adjacent to the substrate in the first direction, the first portion includes the first semiconductor of single-crystal, the second portion extends away from the substrate and extends from the first portion, the second portion includes the first semiconductor of single-crystal, the second portion has a maximum width smaller than a minimum width of the first portion in a second direction intersecting the first direction.

2. The semiconductor memory device according to claim 1, further comprising:
a first insulating film between each of the plurality of first conductive layers and the first semiconductor portion in a second direction intersecting the first direction;
a first charge storage film between each of the plurality of first conductive layers and the first insulating film in the second direction; and
a second insulating film between each of the plurality of first conductive layers and the first charge storage film in the second direction.

3. The semiconductor memory device according to claim 2, further comprising:
a third insulating film between the at least one second conductive layer and the second semiconductor portion in the second direction;
a second charge storage film between the at least one second conductive layer and the third insulating film in the second direction; and
a fourth insulating film between the at least one second conductive layer and the second charge storage film in the second direction,
wherein the third insulating film includes the same material as that of the first insulating film,
the second charge storage film includes the same material as that of the first charge storage film, and
the fourth insulating film includes the same material as that of the second insulating film.

4. The semiconductor memory device according to claim 2, wherein the second pillar further includes a fifth insulating film of a single layered structure between the second semiconductor portion and the second conductive layer in the second direction.

5. The semiconductor memory device according to claim 4, wherein the fifth insulating film includes silicon oxide.

6. The semiconductor memory device according to claim 1, wherein a minimum thickness of one of the at least one second conductive layer in the first direction is larger than a maximum thickness of one of the plurality of first conductive layers in the first direction.

7. The semiconductor memory device according to claim 1,
wherein the first semiconductor of single-crystal includes a single-crystal semiconductor material, and
the second semiconductor of poly-crystal includes a polycrystalline semiconductor material.

8. The semiconductor memory device according to claim 1, further comprising:
a first stack including the plurality of first conductive layers and a plurality of first insulating layers which are alternately stacked in the first direction; and
a second stack including at least one second conductive layer and at least one second insulating layer which are stacked in the first direction.

9. The semiconductor memory device according to claim 1, further comprising:
a third insulating layer between the plurality of first conductive layers and at least one second conductive layer in the first direction,
wherein a minimum thickness of the third insulating layer in the first direction is larger than a minimum thickness of one of a plurality of first insulating layers in the first direction.

10. The semiconductor memory device according to claim 8, further comprising:
a third stack between the substrate and the first stack in the first direction,
wherein the third stack includes a third conductive layer, a fourth insulating layer between the third conductive layer and the first stack, and a fifth insulating layer between the third conductive layer and the substrate, and a minimum thickness of the fourth insulating layer in the first direction is larger than a minimum thickness of one of the plurality of first insulating layers in the first direction.

11. The semiconductor memory device according to claim 1, wherein a minimum length of the first semiconductor portion in the first direction is larger than a minimum length of the second semiconductor portion in the first direction.

12. A semiconductor memory device comprising:
a substrate;
a plurality of first conductive layers which are stacked over the substrate in a first direction;
a second conductive layer which is disposed over the plurality of first conductive layers;
a first pillar which extends inside the plurality of first conductive layers in the first direction, the first pillar including a first semiconductor portion including a first semiconductor of single-crystal; and
a second pillar which extends inside the second conductive layer in the first direction, the second pillar including an insulating portion and a second semiconductor portion, the insulating portion serving as an axis and including an insulator, the second semiconductor portion being disposed on an outer circumference of the insulating portion in view of the first direction, the second semiconductor portion being in contact with the first semiconductor portion, and the second semiconductor portion including a second semiconductor of poly-crystal, wherein a minimum thickness of one of the at least one second conductive layer in the first direction is larger than twice a maximum thickness of one of the plurality of first conductive layers in the first direction.

* * * * *